(12) United States Patent
Tsai et al.

(10) Patent No.: US 9,721,918 B2
(45) Date of Patent: Aug. 1, 2017

(54) CONTACT AREA DESIGN FOR SOLDER BONDING

(71) Applicant: Taiwan Semiconductor Manufacturing Company, Ltd., Hsin-Chu (TW)

(72) Inventors: Pei-Chun Tsai, Zhongli (TW); Yu-Feng Chen, Hsin-Chu (TW); Tin-Hao Kuo, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 88 days.

(21) Appl. No.: 14/584,748

(22) Filed: Dec. 29, 2014

(65) Prior Publication Data

US 2016/0190082 A1 Jun. 30, 2016

(51) Int. Cl.
| | |
|---|---|
| *H01L 23/48* | (2006.01) |
| *H01L 29/40* | (2006.01) |
| *H01L 23/52* | (2006.01) |
| *H01L 23/00* | (2006.01) |
| *H01L 23/498* | (2006.01) |
| *H01L 23/14* | (2006.01) |
| *H05K 1/11* | (2006.01) |

(52) U.S. Cl.
CPC ............ *H01L 24/17* (2013.01); *H01L 23/147* (2013.01); *H01L 23/49822* (2013.01); *H01L 23/49827* (2013.01); *H05K 1/111* (2013.01); *H01L 2224/16057* (2013.01); *H01L 2224/16113* (2013.01); *H01L 2224/16227* (2013.01); *H01L 2224/16238* (2013.01); *H05K 2201/0969* (2013.01); *H05K 2201/10378* (2013.01); *H05K 2201/10674* (2013.01)

(58) Field of Classification Search
CPC . H01L 2224/83385; H01L 2224/16227; H01L 2224/48253; H01L 21/486; H01L 24/81
USPC .............. 257/780.781, 784, 786, 780, 781
See application file for complete search history.

(56) References Cited

U.S. PATENT DOCUMENTS

| | | | |
|---|---|---|---|
| 5,929,521 A * | 7/1999 | Wark ................. | G01R 1/06738 257/692 |
| 6,897,570 B2 * | 5/2005 | Nakajima ........... | H01L 23/5226 257/773 |
| 7,838,424 B2 | 11/2010 | Karta et al. | |
| 7,863,742 B2 | 1/2011 | Yu et al. | |
| 7,932,601 B2 | 4/2011 | Chang et al. | |
| 8,350,384 B2 * | 1/2013 | Pendse ................. | H01L 21/563 257/734 |
| 8,461,694 B1 * | 6/2013 | Sirinorakul ......... | H01L 23/4951 257/777 |
| 8,754,508 B2 | 6/2014 | Chen et al. | |
| 8,772,151 B2 | 7/2014 | Chen | |
| 8,846,548 B2 | 9/2014 | Tu et al. | |
| 2004/0070079 A1 * | 4/2004 | Huang ................... | H01L 24/13 257/778 |

(Continued)

*Primary Examiner* — S. V. Clark
(74) *Attorney, Agent, or Firm* — Slater Matsil, LLP

(57) ABSTRACT

A package component includes a dielectric layer and a metal pad over the dielectric layer. A plurality of openings is disposed in the metal pad. The first plurality of openings is separated from each other by portions of the metal pad, with the portions of the metal pad interconnected to form a continuous metal region.

20 Claims, 26 Drawing Sheets

(56) References Cited

U.S. PATENT DOCUMENTS

| | | | |
|---|---|---|---|
| 2006/0060968 A1* | 3/2006 | Wark | G01R 1/06738 |
| | | | 257/737 |
| 2006/0237855 A1* | 10/2006 | Kroehnert | H01L 23/49816 |
| | | | 257/779 |
| 2009/0008765 A1* | 1/2009 | Yamano | H01L 21/6835 |
| | | | 257/690 |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0262468 A1 | 9/2014 | Chen et al. | |
| 2014/0264885 A1 | 9/2014 | Tsai et al. | |

\* cited by examiner

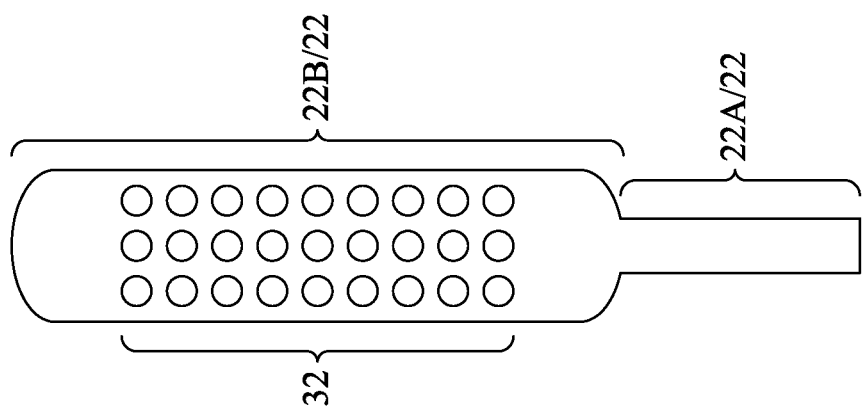

CONTACT AREA DESIGN FOR SOLDER BONDING

BACKGROUND

Package substrates are commonly used for bonding device dies thereon. Package substrates may be used as a buffer for connecting device dies to printed circuit boards and as a routing device. In addition, a plurality of device dies may be bonded to the same package substrate and connected through the package substrate, hence increasing the number of device dies in the respective package.

Some of the package substrates such as coreless substrates are soft and can easily subject to warpage. In the bonding of device dies to these types of package substrates, solder may not be able to attach to the metal traces, resulting in failure to bond.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
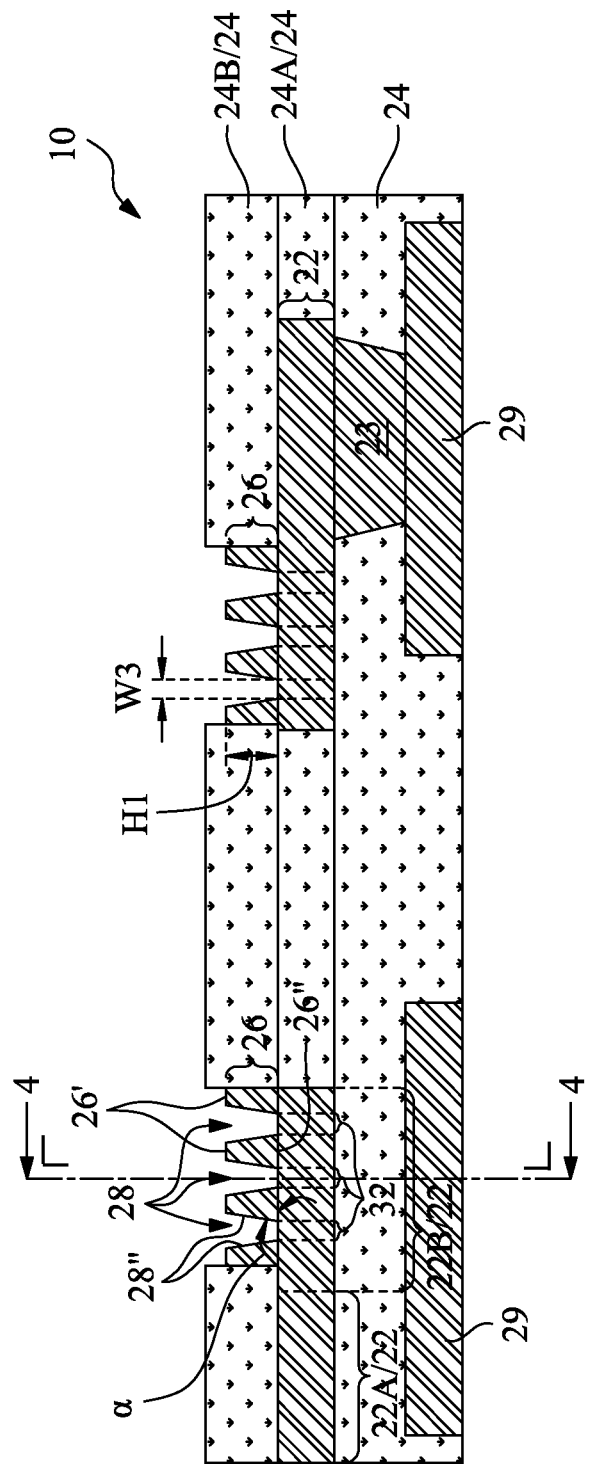
FIGS. 1 through 5B illustrate cross-sectional views and top views of a first package component that includes a metal pad with a positive pattern in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package structure and the method of forming the same are provided in accordance with various exemplary embodiments. The intermediate stages of forming the package structure are illustrated. The variations of the embodiments are discussed. Throughout the various views and illustrative embodiments, like reference numbers are used to designate like elements.

FIG. 1 illustrates a cross-sectional view of package component 10. In accordance with some embodiments of the present disclosure, package component 10 is a package substrate. In the embodiments wherein package component 10 is a package substrate, package component 10 may be a coreless substrate. In alternative embodiments, package component 10 is another type of package component such as an interposer, a device die, or the like.

Package component 10 includes metal lines (traces) 22 and vias 23 in dielectric layers 24 (including 24A and 24B), which may be, for example, laminate films, silicon oxide layers, silicon nitride layers, or the like. In accordance with some exemplary embodiments, dielectric layers 24 are formed of pregreg, Polypropylene (PP), PolyVinylChloride (PVC), Acrylonitril, Butadiene & Styrene (ABS), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), combinations thereof, or multi-layers thereof. Alternatively, metal lines 22 and vias 23 may be formed over a semiconductor substrate (such as a silicon substrate, not shown) or a dielectric core (not shown), and in the dielectric layers that are formed over the semiconductor substrate or dielectric core.

Package component 10 includes conductive features on opposite sides, wherein the conductive features on the opposite sides are inter-coupled through the conductive features such as metal lines 22 and vias 23 embedded in dielectric layers 24. In accordance with some exemplary embodiments, metal features 26 are formed on a first surface (the illustrated top surface) of package component 10, and metal features 29 are formed on a second surface (the illustrated bottom surface) of package component 10. Metal feature 29 may include metal pads, metal traces, and/or the like.

Figure 2:
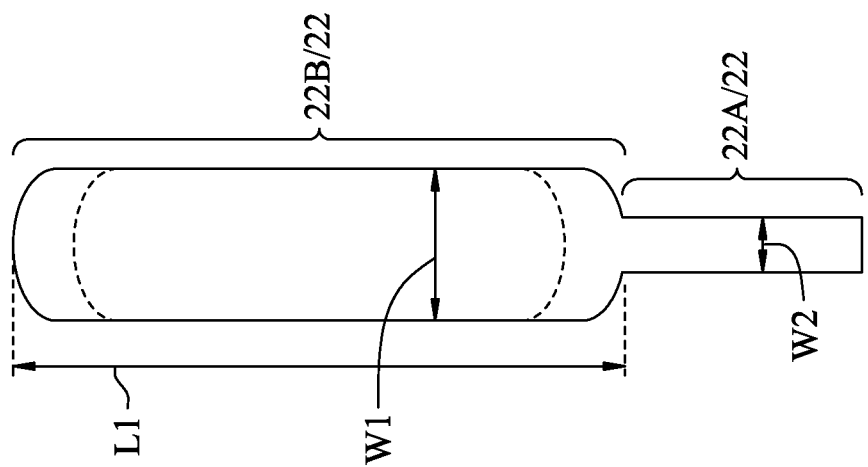

In accordance with some exemplary embodiments, each of metal traces 22 as shown in FIG. 1 includes narrow portion 22A and wider portion 22B that is wider than narrow portion 22A. FIG. 2 illustrates a top view of metal trace 22. Throughout the description, the narrow portion 22A is referred to as trace portion 22A, and the wide portion 22B is referred to as pad portion 22B. Wide portion 22B has an elongated top view shape with length L1 greater than width W1. The ratio of L1 to W1 is greater than 1 and may be smaller than 4 in some embodiments. Width W1 of pad portion may be greater than about 150 percent, or about 350 percent the width W2 of trace portion 22A. In some exemplary embodiments, length L1 of metal pad 26 is in the range between about 40 µm and about 60 µm, between about 60 µm and about 80 µm, between about 80 µm and about 100 µm, or between about 100 µm and about 120 µm. Width W1 of metal pad 26 may be in the range between about 10 µm and about 20 µm, between about 20 µm and about 30 µm, or between about 30 µm and about 40 µm. In accordance with some exemplary embodiments as shown in FIG. 2A, pad portion 22B terminates at one end with the other end connected to trace portion 22A. In accordance with alternative embodiments, both ends of pad portion 22B may be connected to trace portions.

There may be a single or a plurality of layers of metal traces similar to metal traces 22 in FIG. 1, wherein the multiple layers of metal traces are interconnected through metal vias. As shown in FIG. 1, metal traces 22 are in dielectric layer 24A. In accordance with some exemplary embodiments of the present disclosure, metal traces 22 are formed of a metal or metal alloy including copper, aluminum, titanium, nickel, or alloys thereof. Dielectric layer 24B covers dielectric layer 24A and metal traces 22. Metal pads 26 are formed over metal traces 22. In the subsequent discussion, a single metal pad 26, which is on the left of FIG. 1, is discussed, and other metal pads 26 may have a similar structure as the discussed metal pad 26.

As shown in FIG. 1, metal pad 26 is formed in dielectric 24B. In accordance with some embodiments, the top surface of metal pad 26 is lower than the top surface of dielectric layer 24B. Accordingly, metal pad 26 may be recessed relative to the top surface of dielectric layer 24B. The edges of metal pad 26 may be vertically aligned to the edges of dielectric layer 24B. In accordance with some exemplary embodiments of the present disclosure, metal pads 26 are formed of a metal or metal alloy including copper, aluminum, titanium, nickel, or alloys thereof. Metal pads 26 may also have a composite structure including more than one layer. For example, each of metal pads 26 may include a copper layer and a nickel layer on the top of the copper layer. In some exemplary embodiments, metal pad 26 has height H1 in the range between about 10 µm and about 15 µm, between about 15 µm and about 20 µm, or between about 20 µm and about 25 µm.

Figure 3:
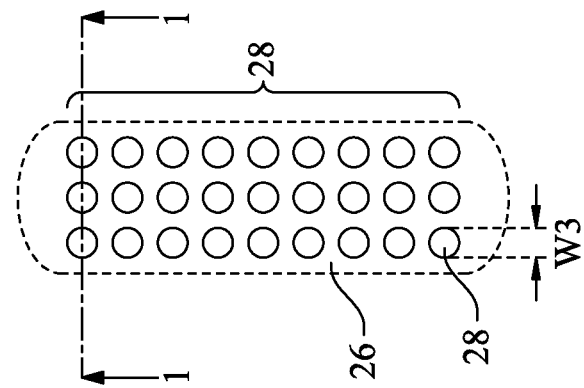

Metal pad 26 includes a plurality of portions separated by spaces 28, as shown in FIG. 1, wherein openings 28 are the openings in metal pad 26. FIG. 3 illustrates a top view of metal pad 26, wherein the cross-sectional view in FIG. 1 is obtained from the plane containing line 1-1 in FIG. 3. In accordance with some embodiments, metal pad 26 includes a plurality of openings 28 therein, wherein openings 28 may penetrate through metal pad 26, as shown in FIG. 1. Width W3 of openings 28 may be in the range between about 5 µm and about 10 µm, or between about 10 µm and about 15 µm.

In these embodiments, the aspect ratio H1/W3 (also refer to FIG. 1) may be in the range between about 1.5 and about 2, between about 2 and about 3, between about 3 and about 4, or between about 4 and about 5. In alternative embodiments (not shown), openings 28 extend from the top surface 26' (FIG. 1) of metal pad 26 into an intermediate level between the top surface 26' and bottom surface 26" of metal pad 26.

The metal pad 26 shown in FIG. 3 is referred to as a positive pattern, wherein openings 28 in metal pad 26 are discrete openings separated from each other by portions of the respective metal pad 26. In alternative embodiments, as will be discussed in detail referring to FIGS. 8 through 13, metal pad 26 may also have a negative pattern wherein different portions of metal pad 26 are discrete portions fully isolated from each other by a continuous opening.

Referring back to FIG. 3, openings 28 may have different top-view shapes including, but not limited to, circles, rectangles, squares, hexagons, octagons, and ovals. The portions of metal pad 26 encircling openings 28 are interconnected to form a continuous metal pad. Furthermore, openings 28 may be arranged as an array, a beehive style, or some other applicable pattern.

As shown in FIG. 1, the sidewalls 28' of openings 28 are tilted, with the tilt angle α being smaller than 90 degrees, and which may be in the range of about 45 degrees to about 85 degrees. The tilted sidewalls 28' of openings 28 may be formed by depositing a blanket metal layer and etching the blanket metal layer to form openings 28, followed by an over-etch to make sidewalls 28' slanted. In alternative embodiments, the sidewalls of openings 28 are vertical (perpendicular to the top surface of dielectric layer 24B).

Figure 4:
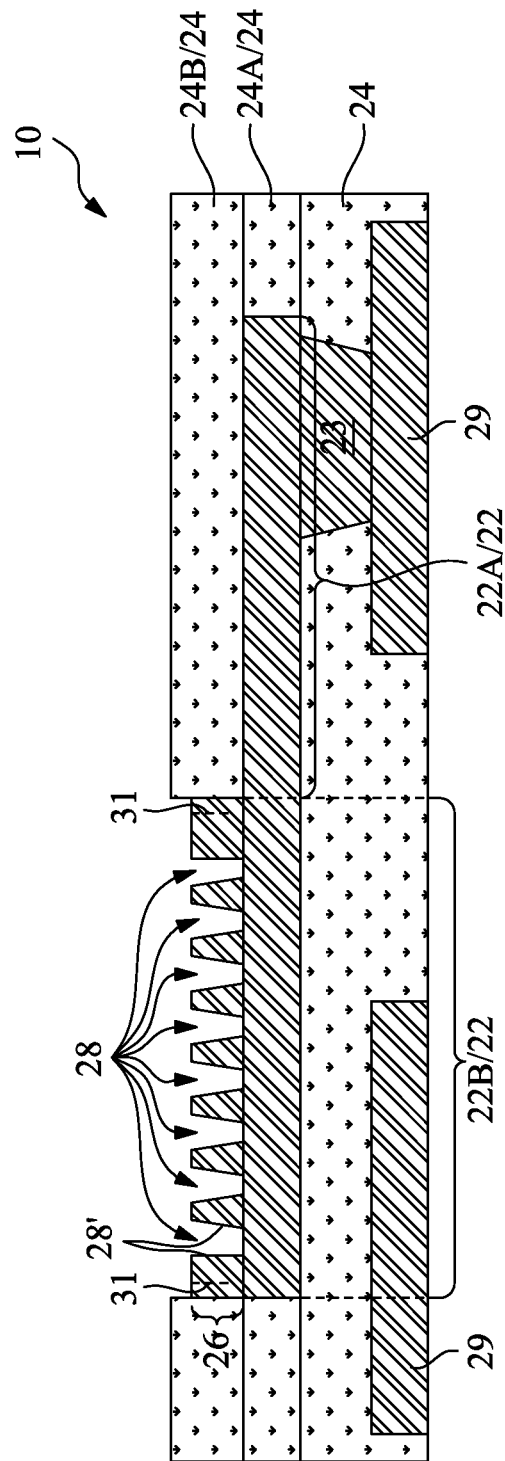

FIG. 4 illustrates another cross-sectional view of package component 10, wherein the cross-sectional view is obtained from the plane containing line 4-4 in FIG. 1. As shown in FIG. 4, metal pad 26 also includes a plurality of openings 28 in this cross-sectional view, wherein the remaining portion of metal pad 26 overlaps pad portion 22B. In accordance with some embodiments, in subsequent boding process, when solder region 42 (FIG. 7) is bonded to metal pad 26, the solder region may be in contact with the entireties of the exposed surfaces of metal pad 26. Alternatively, solder region 42 in FIG. 6 may be in contact with a middle portion of metal pad 26, wherein dashed lines 31 mark the outer boundaries of solder region 42.

Figure 5A:
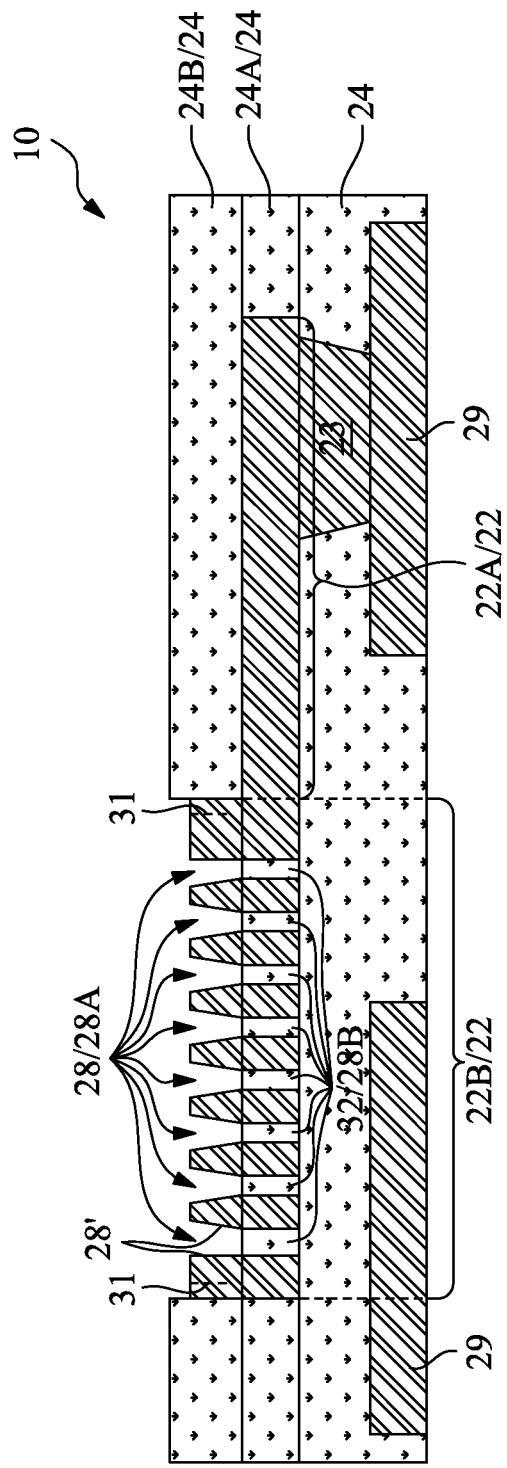

In accordance with some embodiments of the present disclosure, as shown in FIG. 2, pad portion 22B is a solid metal pad with no openings therein. Accordingly, in the top view of package component 10, as shown in FIGS. 1 and 4, portions of pad portion 22B may be exposed through openings 28 in metal pad 26. In accordance with alternative embodiments, as shown in FIG. 5A, openings 28 penetrate through metal pad 26 and the underlying pad portion 22B. Accordingly, in these embodiments, openings 28 include upper portions 28A in metal pad 26 and lower portions in pad portion 22B. The upper portions 28A may not be filled with a dielectric material. On the other hand, the lower portions 28B of openings 28 are filled with a dielectric material to form dielectric regions 32. In accordance with some embodiments, regions 32 are parts of, and are formed of the same dielectric material as, dielectric layer 24A. The top surface of dielectric regions 32 may be level with the top surface of dielectric layer 24A and metal trace 22 in accordance with some embodiments.

FIG. 5B illustrates a top view of the metal trace 22 as in FIG. 5A. As shown in FIG. 5B, regions 32 are dielectric regions separated from each other by pad portion 22B.

Figure 6:
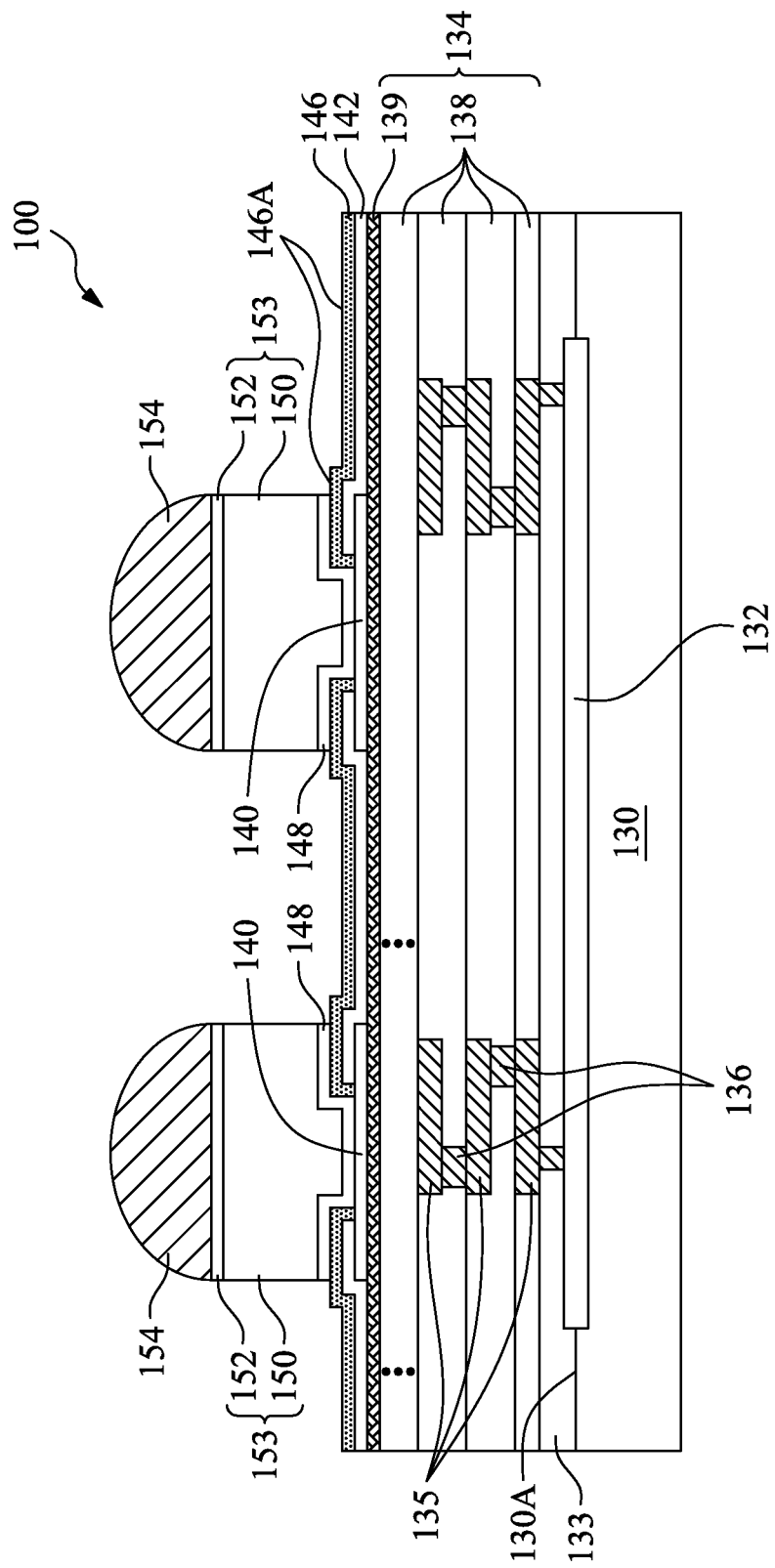
FIG. 6 illustrates a cross-sectional view of a second package component in accordance with some embodiments.

FIG. 6 illustrates a cross-sectional view of package component 100 in accordance with exemplary embodiments. In some embodiments, package component 100 is a device die, and semiconductor substrate 130 may be a bulk silicon substrate or a silicon-on-insulator substrate. In alternative embodiments, other semiconductor materials including group III, group IV, and group V elements may also be included in semiconductor substrate 130. Integrated circuit 132 is formed at surface 130A of semiconductor substrate 130. Integrated circuit 132 may include Complementary Metal-Oxide-Semiconductor (CMOS) devices therein. In alternative embodiments, package component 100 is an interposer die, a package substrate, a package, or the like. In the embodiments wherein package component 100 is an interposer die, package component 100 does not include active devices such as transistors therein. Package component 100 may include passive devices such as resistors and capacitors or be free from passive devices in these embodiments.

Package component 100 may further include Inter-Layer Dielectric (ILD) 133 over semiconductor substrate 130 and interconnect structure 134 over ILD 133. Interconnect structure 134 includes metal lines 135 and vias 136 formed in dielectric layers 138. In some embodiments, dielectric layers 138 are formed of low-k dielectric materials. The dielectric constants (k values) of the low-k dielectric materials may be lower than about 3.0 or about 2.5, for example. Metal lines 135 and vias 136 may be formed of copper, a copper alloy, or other metals.

Metal pads 140 are formed over interconnect structure 134 and may be electrically coupled to circuit 132 through metal lines 135 and vias 136 in interconnect structure 134. Metal pads 140 may be aluminum pads or aluminum-copper pads.

Passivation layer 142 is formed to cover the edge portions of metal pads 140. The central portions of metal pads 140 are exposed through (and under) the openings in passivation layer 142. Passivation layer 142 may be a single layer or a composite layer and may be formed of a non-porous material. In some embodiments, passivation layer 142 is a composite layer comprising a silicon oxide layer (not shown), and a silicon nitride layer (not shown) over the silicon oxide layer. In alternative embodiments, passivation layer 142 comprises Un-doped Silicate Glass (USG), silicon oxynitride, and/or the like. There may be a single passivation layer or more than one passivation layer. For example, under metal pads 140, there may be passivation layer 139. In which embodiments, passivation layer 139 and passivation layer 142 are also referred to as passivation-1 (or pass1) 139 and passivation-2 (or pass2) 142 throughout the description.

Polymer layer 146 is formed over passivation layer 142 and covers passivation layer 142. Polymer layer 146 may comprise a polymer such as an epoxy, polyimide, benzocyclobutene (BCB), polybenzoxazole (PBO), or the like. Polymer layer 146 is patterned to form openings, through which metal pads 140 are exposed.

Under-Bump Metallurgies (UBM) 148 are formed over metal pads 140. Each of UBMs 148 may have a portion over polymer layer 146 as well as a portion extending into the opening in polymer layer 146 to contact the respective underlying metal pad 140. In some embodiments, each of UBMs 148 includes a titanium layer and a seed layer over the titanium layer, wherein the seed layer may be formed of copper or a copper alloy.

Metal pillars 150 are formed over UBMs 148 and are co-terminus with the respective underlying UBMs 148. For example, each of the edges of metal pillars 150 is aligned to a corresponding edge of one of UBMs 148. In some exemplary embodiments, metal pillars 150 are formed of a non-solder metal or a metal alloy that does not melt at the normal reflow temperatures (for example, about 200° C. to about 260° C.) of solders. In some exemplary embodiments, metal pillars 150 are formed of copper or a copper alloy.

In addition to metal pillars 150, there may be additional metal layers such as metal layer 152 formed on each of metal pillars 150, wherein metal layer 152 may include a nickel layer, a palladium layer, a gold layer, or multi-layers thereof. Throughout the description, metal pillars 150 and overlying metal layers 152 (if any) are in combination referred to as metal bumps 153. Solder caps 154 may also be formed on metal bumps 153, wherein solder caps 154 may be formed of a Sn—Ag alloy, a Sn—Cu alloy, a Sn—Ag—Cu alloy, or the like and may be lead-free or lead-containing.

Figure 7:
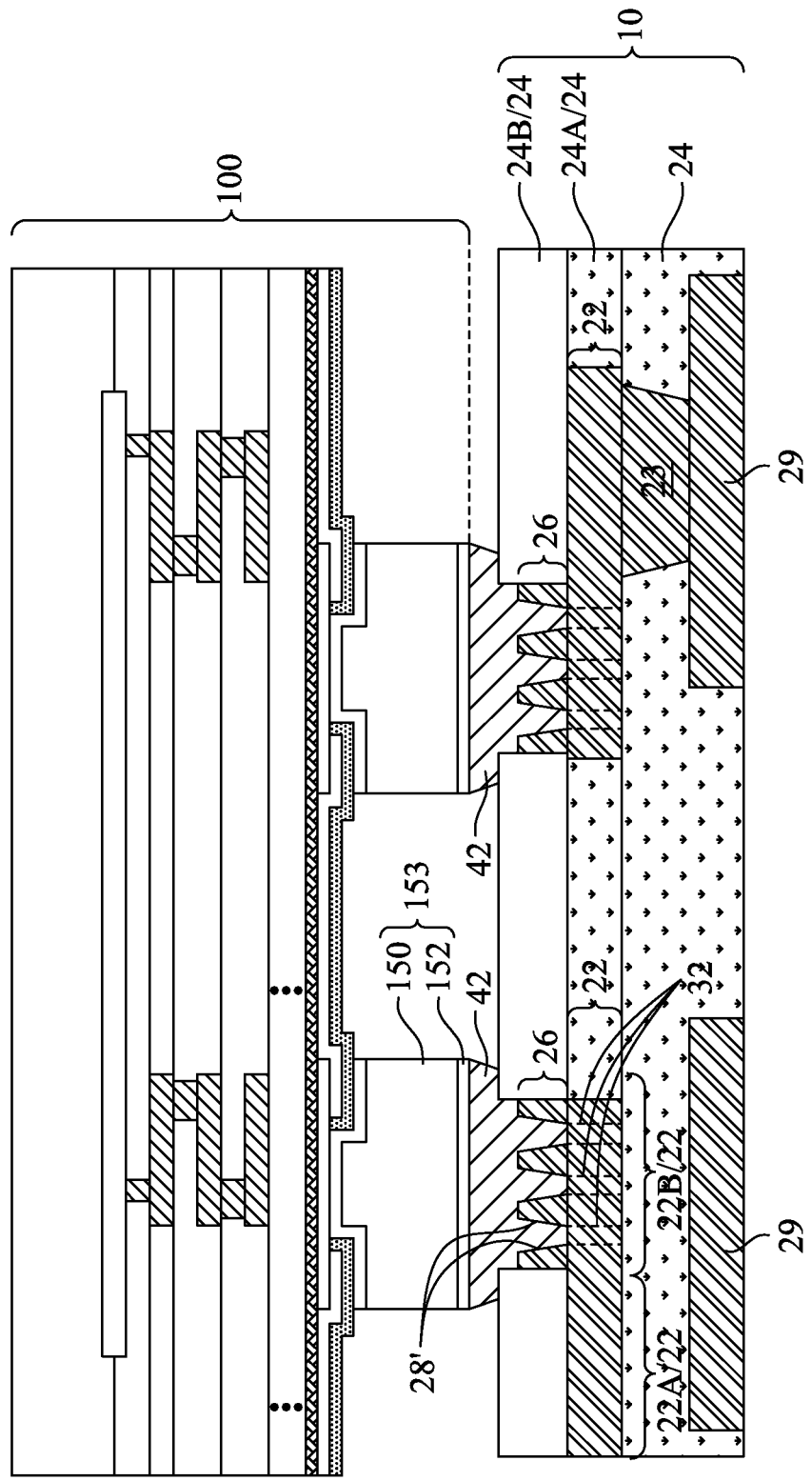
FIG. 7 illustrates a cross-sectional view of a package including the first package component bonded to the second package component in accordance with some embodiments.

Referring to FIG. 7, package component 100 is bonded to package component 10 through flip-chip bonding, wherein solder regions 42 are reflowed and are then solidified in a cooling process. Solder regions 42 bond metal pillars 150 to their respective metal pads 26, wherein solder regions 42 include the solder in solder caps 154 (FIG. 6) and may or may not include additional solder. Solder regions 42 further fill into openings 28 (FIGS. 1, 4, and 5A). In FIG. 7, regions 32 are marked using dashed lines to indicate that these regions may be filled with a dielectric material or may be parts of a solid pad portion 22B of metal trace 22. It is appreciated that although FIG. 7 illustrates that solder regions 42 fill the entireties of openings 28, it is also possible that solder regions 42 fill the upper portions of openings 28 so that the lower portions of openings 28 are not filled with solder and form air gaps. In some exemplary embodiments, spacing S1 between neighboring metal pads 26 is in the range between about 45 μm and about 60 μm, between about 60 μm and about 80 μm, between about 80 μm and about 100 μm, or between about 100 μm and about 115 μm.

Regardless of whether solder regions 42 fill openings 28 partially or entirely, solder regions 42 contact the sidewalls 28' of some portions of metal pad 26, wherein the sidewalls of the portions of metal pad 26 face openings 28 (FIGS. 1, 4, and 5A). Accordingly, since the top surfaces and the sidewalls of metal pad 26 are not coplanar, in the bonding of solder regions 42 to metal pad 26, each portion of solder regions 42 no longer has a continuous and smooth surface in contact with metal pad 26. Instead, the surfaces of the molten solder regions 42 are broken into different parts by metal pads 26. The surface tension of the molten solder regions 42 is thus broken. In addition, the surface area of metal pads 26 is increased compared to a metal pad with no opening therein. Hence, the contact area of the metal pads 26 according to the embodiments of the present disclosure is increased, and the strength of the bonding between metal pads 26 and the corresponding solder regions 42 is improved.

FIGS. 8 through 13 illustrate the cross-sectional views and top views of some package component and the respective bonded package in accordance with alternative embodiments. These embodiments are similar to the embodiments in FIGS. 1 through 7, except that metal pads 26 in these embodiments have negative patterns. Unless specified otherwise, the materials and the formation methods of the components in these embodiments are essentially the same as their like components, which are denoted by like reference numerals in the embodiments shown in FIGS. 1 through 7. The details regarding the formation process and the materials of the components shown in FIGS. 8 through 13 (and the embodiments in FIGS. 14 and 15) may thus be found in the discussion of the embodiments shown in FIGS. 1 through 7.

Figure 8:
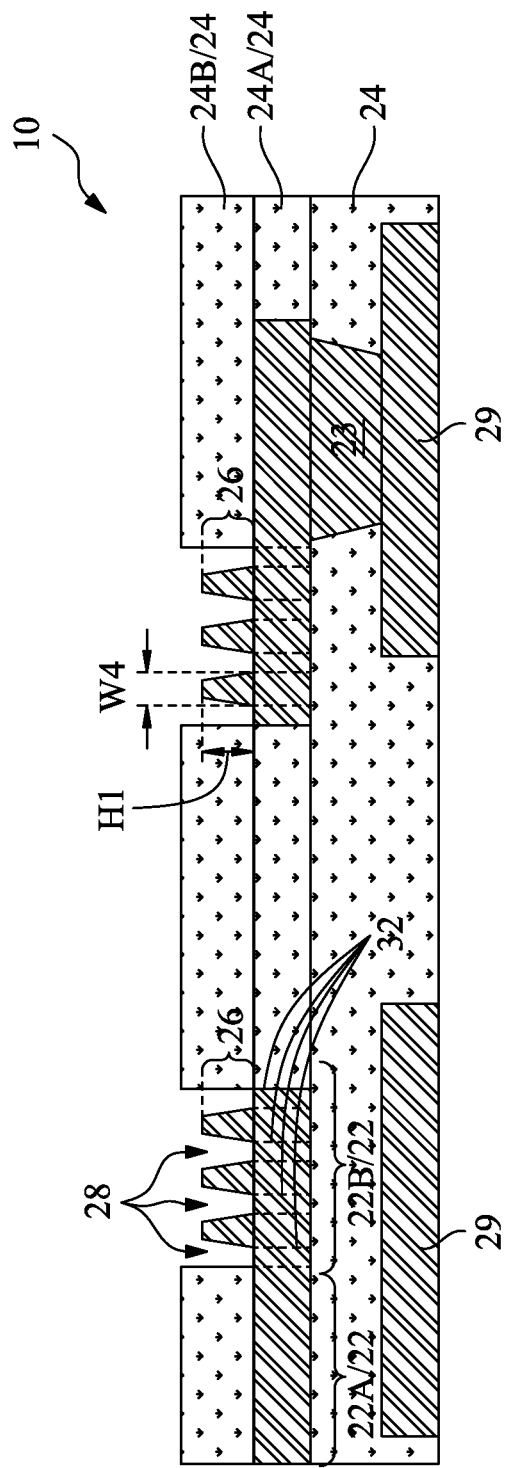
FIGS. 8 through 12 illustrate cross-sectional views and top views of a first package component that includes a metal pad with a negative pattern in accordance with some embodiments.

Referring to FIG. 8, which is a cross-sectional view, package component 10 includes metal pads 26 in dielectric layer 24B. Metal traces 22 are underlying the respective metal pads 26 and are in dielectric layer 24A. Regions 32, which are represented using dashed lines, may be filled with a dielectric material the same as the dielectric material of dielectric layer 24A or may be metal regions that are the integrated parts of a solid trace portion 22B. In these embodiments, regions 32 are metal regions. Each of metal pads 26 includes a plurality of discrete portions fully separated from each other.

Figure 10:
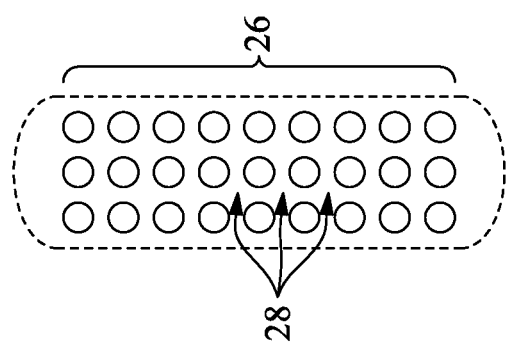
Figure 9:
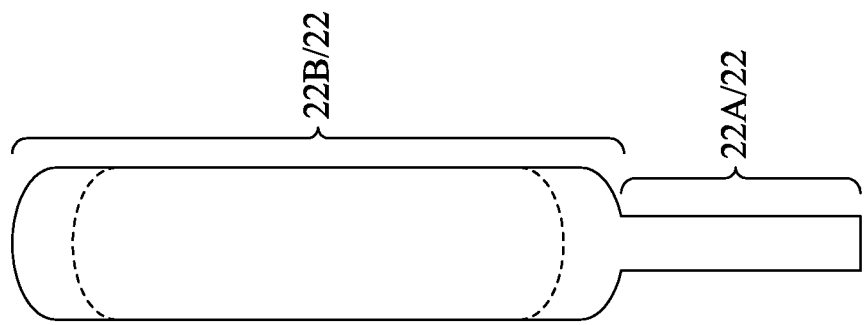

FIGS. 9 and 10 schematically illustrate the top views of metal trace 22 and metal pad 26, respectively, in accordance with some embodiments. In these embodiments, pad portion 22B of metal trace 22 is a solid pad, as shown in FIG. 9. Accordingly, regions 32 in FIG. 8 are also formed of the same metallic material as the rest of pad portion 22B.

As shown in FIG. 10, metal pad 26 includes a plurality of discrete portions that are physically separated from each other by spacing(s) 28. A dashed ring is shown to schematically illustrate where metal pad 26 is located, wherein the dashed ring in FIG. 10 corresponds to the dashed ring in FIG. 9. The discrete portions of metal pad 26 (FIG. 10) in accordance with these embodiments are electrically interconnected through the underlying pad portion 22B (FIG. 9). In some exemplary embodiments, width W4 of the discrete portions of metal pad 26 is in the range between about 5 μm and about 10 μm, or between about 10 μm and about 15 μm. Ratio H1/W4 (also refer to FIG. 8) may be in the range between about 1.5 and about 2, between about 2 and about 3, between about 3 and about 4, or between about 4 and about 5.

Figure 12:
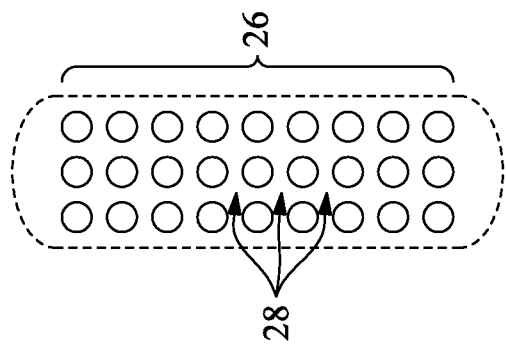
Figure 11:
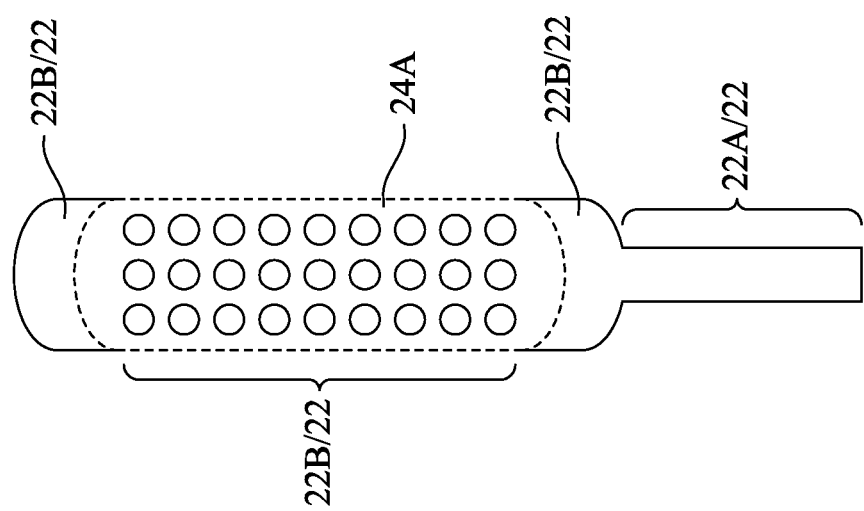

FIGS. 11 and 12 schematically illustrate the top views of metal trace 22 and metal pad 26 in accordance with other embodiments. Metal pad 26 in these embodiments is similar to the metal pad 26 in FIG. 10. In these embodiments, as shown in FIG. 11, pad portion 22B of metal trace 22 also includes a plurality of discrete portions that are fully separated from each other by a dielectric material, which is also the same material as that of dielectric material 24A. Accordingly, the dielectric material is also denoted as dielectric material 24A in FIG. 12.

As shown in FIG. 12, metal pad 26 also includes a plurality of discrete portions that are physically separated from each other by spacing 28, which is a continuous spacing. The discrete portions of metal pad 26 in accordance with these embodiments are electrically insulated from each other, although each discrete portion of metal pad 26 is aligned with, in contact with, and hence is electrically connected to, a respective discrete portion of the underlying pad portion 22B.

Figure 13:
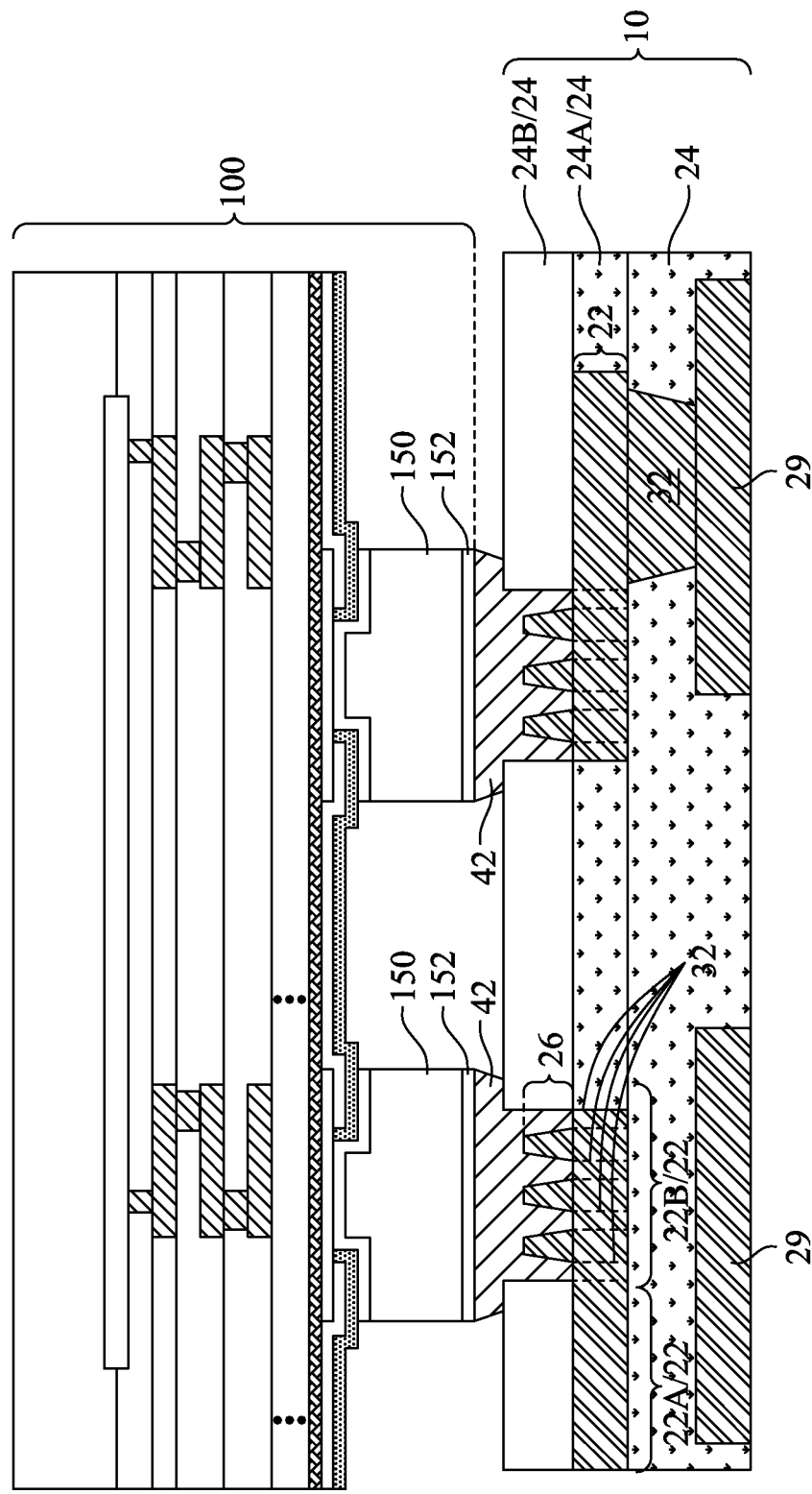
FIG. 13 illustrates a cross-sectional view of a package including the first package component bonded to a second package component in accordance with some embodiments.

FIG. 13 illustrates a package, which includes package component 100 and package component 10 bonded to package component 100. Package component 10 may include the metal pad 26 and the metal trace shown in FIGS. 9 and 10 or FIGS. 11 and 12. In accordance with these embodiments, each of solder regions 42 is in contact with the top surfaces and the sidewalls of the plurality discrete portions of the respective metal pad 26. Accordingly, the discrete portions of metal pad 26 are electrically connected to, and are electrically interconnected by, solder region 42. Again, in these embodiments, the topology of metal pad 26 results in an increase in the strength of bonding due to the break of surface tension and the increased contact area.

Figure 14:
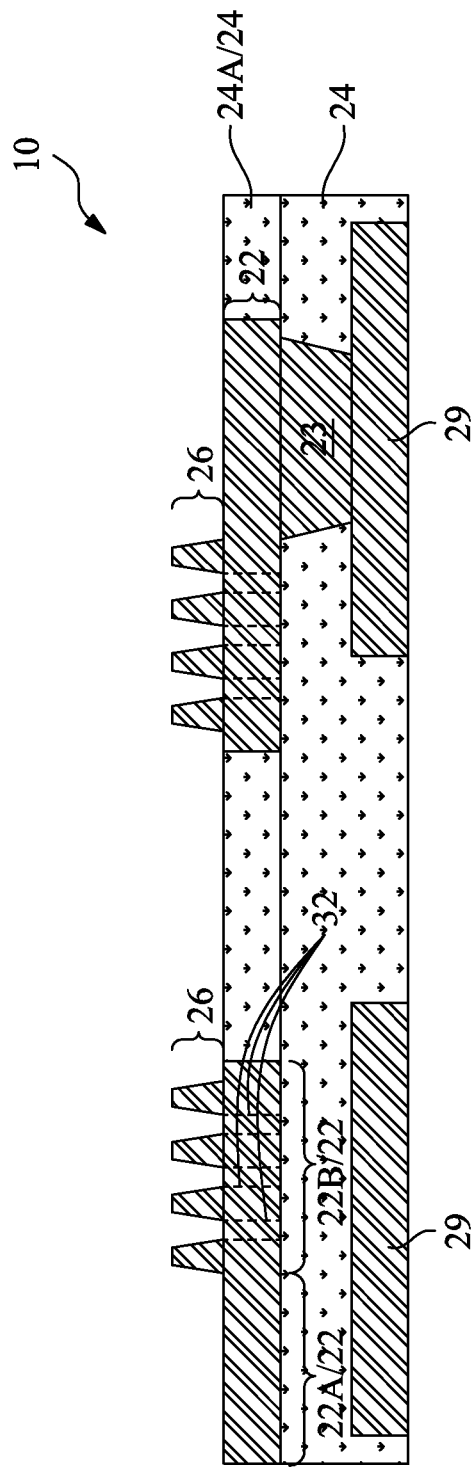
FIG. 14 illustrates a cross-sectional view of a package including a package component with a protruding metal pad in accordance with some embodiments.
Figure 15:
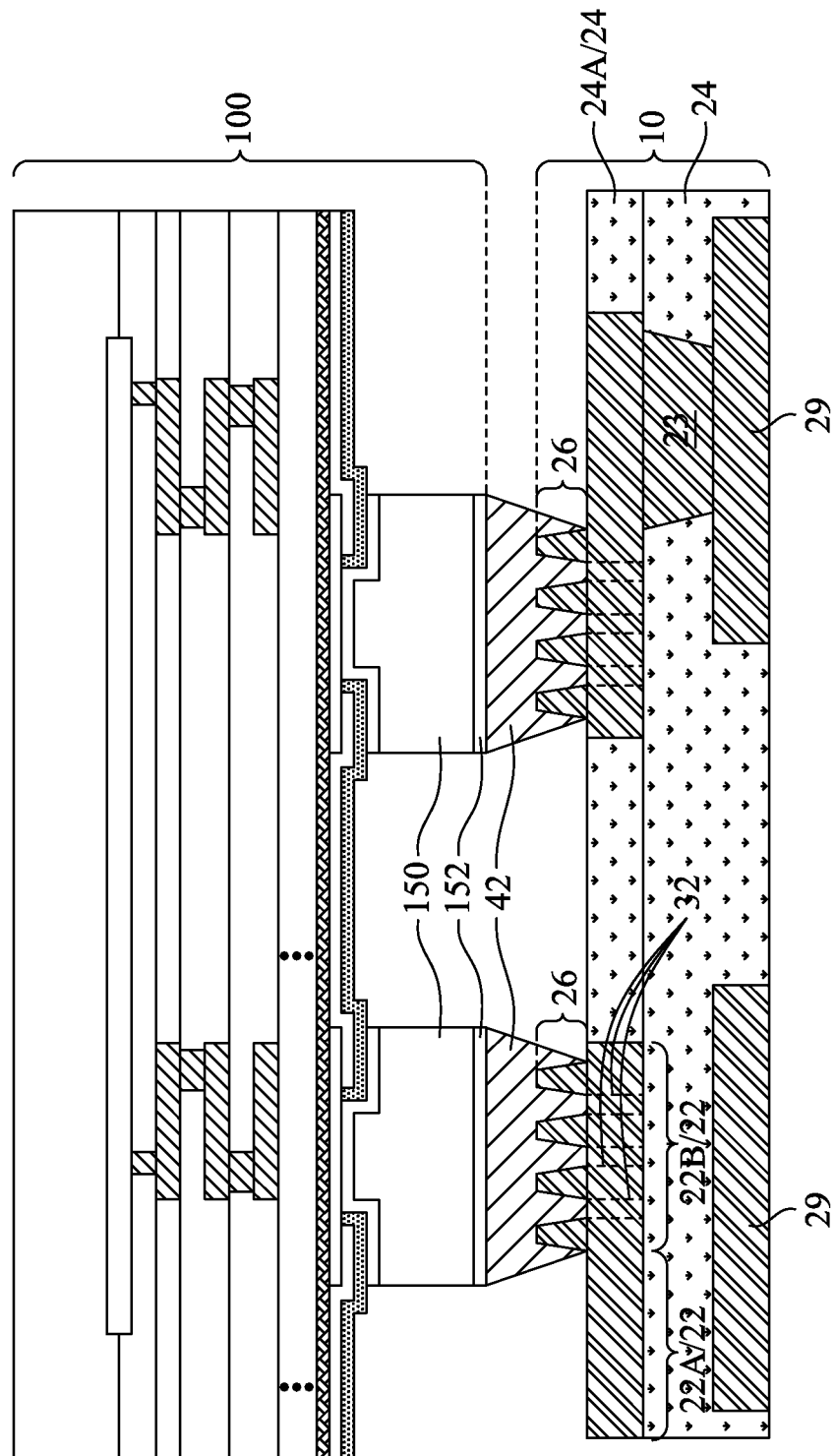
FIG. 15 illustrates a cross-sectional view of a package including the package component with the protruding metal pad in accordance with some embodiments.

FIGS. 14 and 15 illustrate the cross-sectional views of package components 10 and the resulting bonded packages in accordance with alternative embodiments. These embodiments are similar to the embodiments in FIGS. 1 through 13, except that metal pads 26 are protruding pads. For example, as shown in FIG. 14, metal pads 26 are over the top surface of the top dielectric layer 24A. In these embodiments, no dielectric layer is formed over dielectric layer 24A. Accordingly, the top surface of metal trace 22 may be exposed.

In FIG. 14, regions 32 in pad portion 22B of metal trace 22 are illustrated using dashed line to indicate that these regions may be filled with a dielectric material. The top view of the respective metal trace is essentially the same as shown in FIG. 5B. In alternative embodiments, regions 32 are portions of a solid metal pad portion 22B, which is shown in FIG. 2.

FIG. 15 illustrates the package with package component 100 bonded to package component 10. Since there is no dielectric material on the opposite sides of metal pads 26, solder regions 42 are also in contact with the outer sidewalls of metal pads 26, hence forming a Bump-On-Trace (BOT) structure.

In accordance with some embodiments of the present disclosure, metal pads 26 have a positive pattern, and the top view of metal pad is essentially the same as shown in FIG. 3, wherein openings 28 are separated from each other by a continuous metal pad 26. In accordance with alternative embodiments, metal pads 26 have a negative pattern, and the top view of metal pad 26 is essentially the same as shown in FIGS. 10 and 11, wherein discrete portions of metal pad 26 are separated from each other.

The above-discussed embodiments of the present disclosure have some advantageous features. By forming openings in metal pads, the metal pads that otherwise have flat top surfaces now have uneven surfaces. Since it is more difficult for the molten solder regions in contact with large flat top surfaces to attach to the large flat surfaces due to the high surface tension, cold joints may form, and the yield of the bonding process is adversely affected if solder region are to be bonded to a metal pad/trace with a large and flat top surface. In accordance with the embodiments of the present disclosure, the top surfaces of the metal pads are broken into smaller pieces, which may also tilt in different directions, the surface tension of solder regions is broken, and hence the bonding of solder to the metal pads is easier. In addition, the metal pads in accordance with the embodiments of the present disclosure may have a greater contact area, and hence the bonding strength is improved.

FIGS. 17A, 17B, 18A, 18B, 19, and 20 illustrate cross-sectional views of intermediate stages in the formation of package component 10 in accordance with alternative embodiments. These embodiments are similar to the embodiments in FIGS. 1 through 15, except that no metal trace or metal pad is formed directly underlying and connected to metal pads 26. Rather, metal pads 26 are connected to the metal traces that are at the same level as metal pads 26. Unless specified otherwise, the materials and the formation methods of the components in these embodiments are essentially the same as the like components, which are denoted by like reference numerals in the embodiments shown in FIGS. 1 through 15. The details regarding the formation process and the materials of the components shown in FIGS. 17A through 20 may thus be found in the discussion of the embodiment shown in FIGS. 1 through 15.

Figure 17A:
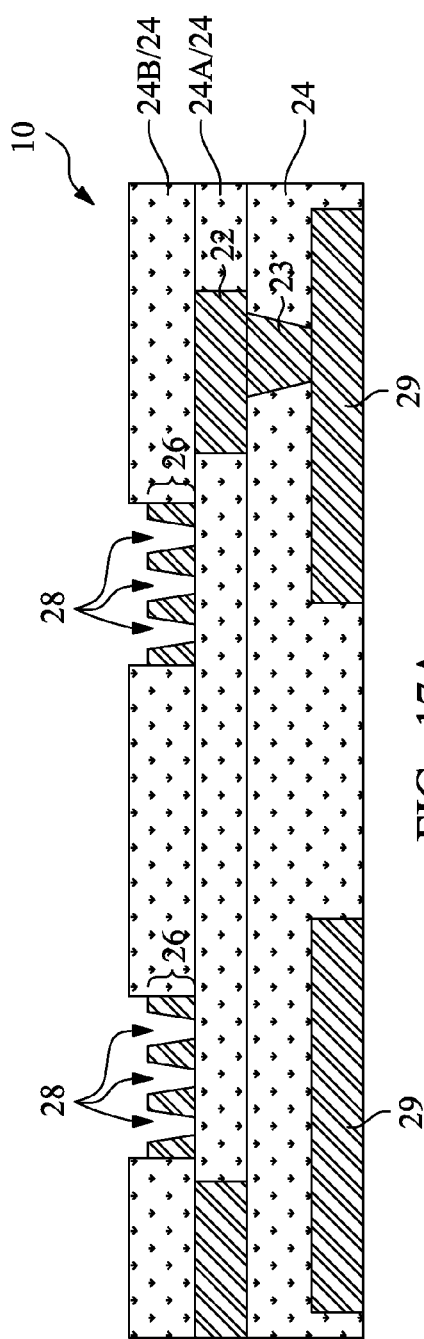
FIGS. 17A and 17B illustrate the cross-sectional views of some package components in accordance with some embodiments.

Referring to FIG. 17A, package component 10 is provided. Metal pads 26 are formed in dielectric layer 24B, and are over and contacting the top surface of dielectric layer 24A. In these embodiments, no metal trace in dielectric layer 24A is formed to be directly underlying and connected to metal pads 26.

Figure 18B:
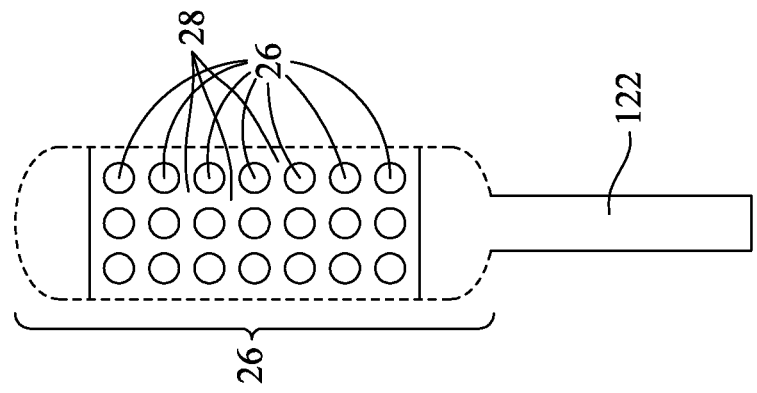
FIGS. 18A and 18B illustrate the top views of metal pads in accordance with some embodiments.
Figure 18A:
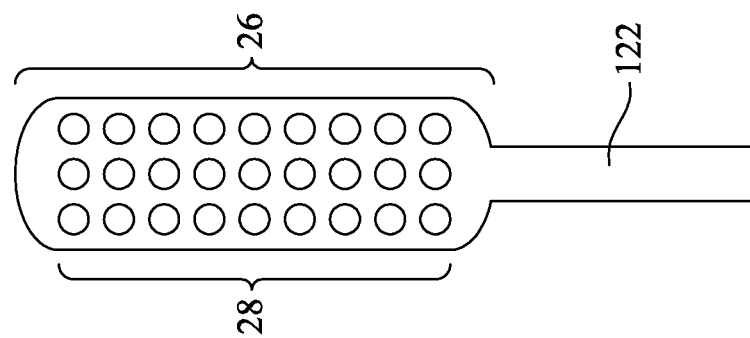

FIGS. 18A and 18B illustrate the top views of metal pads 26 and the connecting traces. FIG. 18A illustrates an exemplary metal pad 26 with a positive pattern, wherein openings 28 are formed in metal pad 26. Metal trace 122, which is at the same level as metal pad 26, is connected to metal pad 26, so that signals may be routed from metal pad 26 to other parts through metal trace 122.

Figure 19:
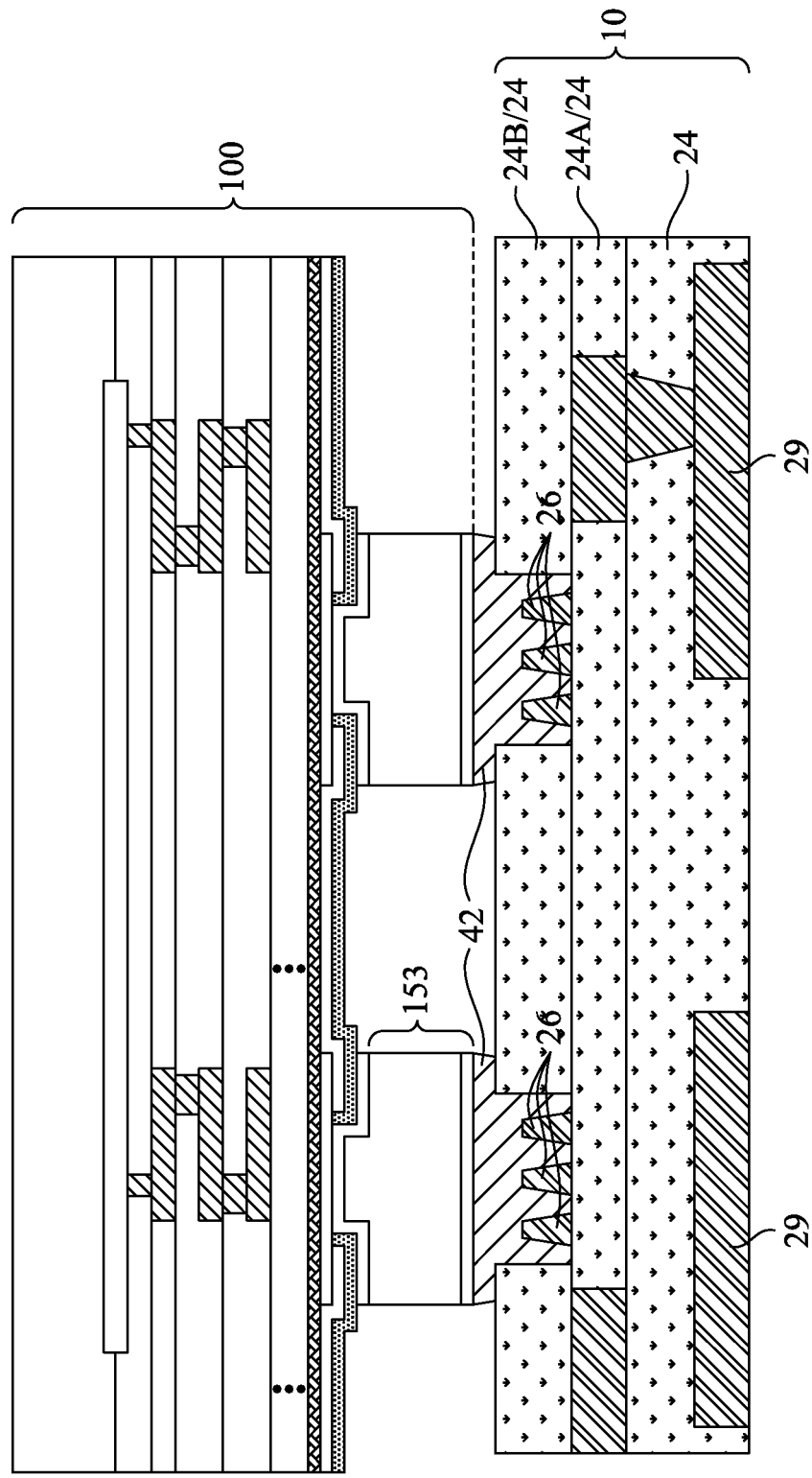
FIGS. 19 and 20 illustrate the cross-sectional views of bonded packages in accordance with some embodiments.
Figure 20:
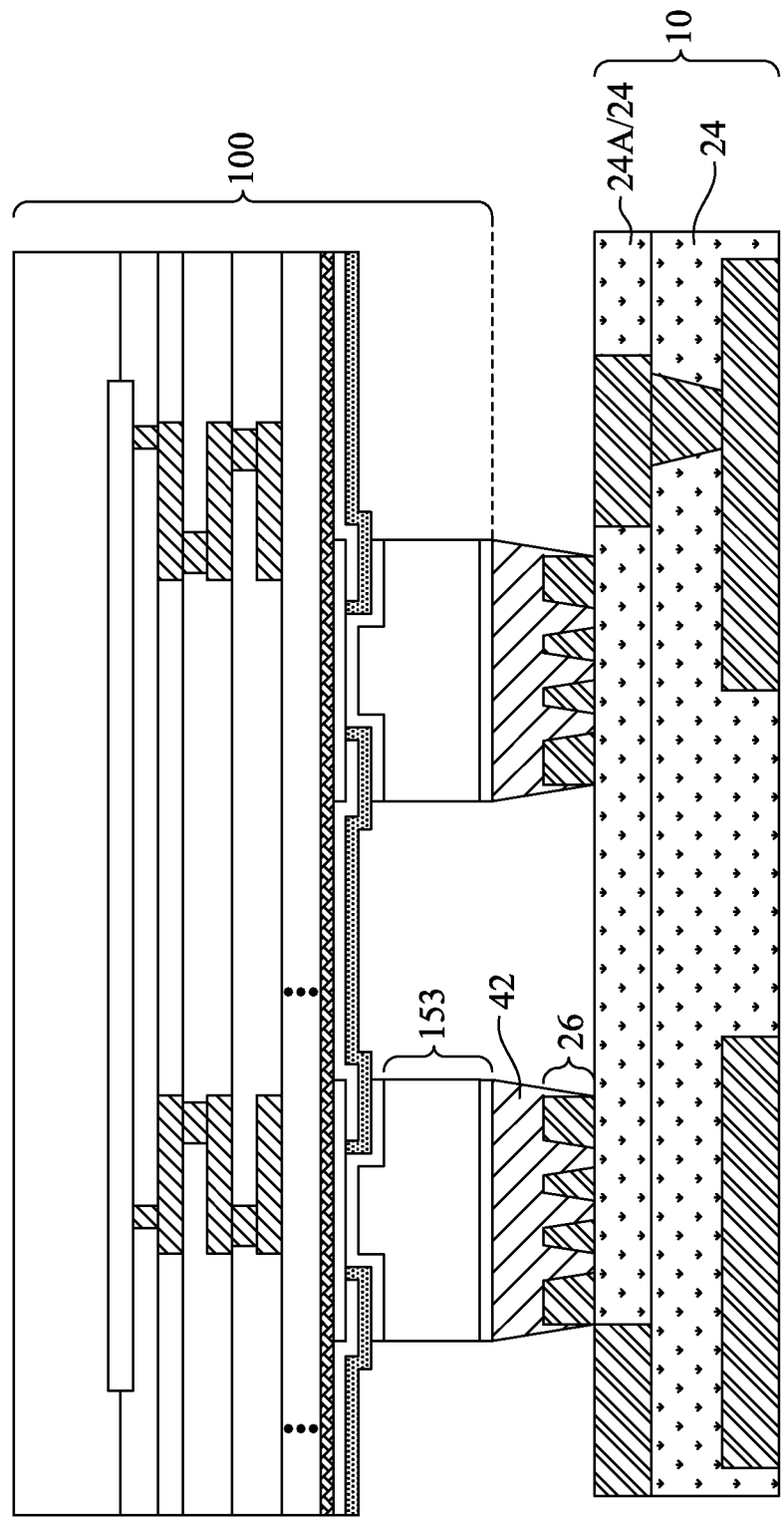

FIG. 18B illustrates an exemplary metal pad 26 with a negative pattern, wherein opening 28 separates metal pad 26 as a plurality of discrete portions that are not connected to each other. Metal pad 26 is close to metal trace 122. In some embodiments metal pad 26 includes a portion connected to metal trace 122, with other portions disconnected from metal trace 122. The portions of metal pad 26 disconnected from metal trace 122 will be electrically connected to metal trace 122 through solder region 42, as shown in FIGS. 19 and 20. Solder region 42 will fill into the opening 28 in the subsequent bonding.

Referring to FIG. 19, package component 100 is bonded to package component 10 through flip-chip bonding, wherein solder regions 42 are reflowed and are then solidified in a cooling process. Solder regions 42 bond metal pillars 153 to their respective metal pads 26. Solder regions 42 further fill into openings 28 (FIGS. 18A and 18B). The bottoms of solder regions 42 are in contact with the top surface of dielectric layer 24A.

Figure 17B:
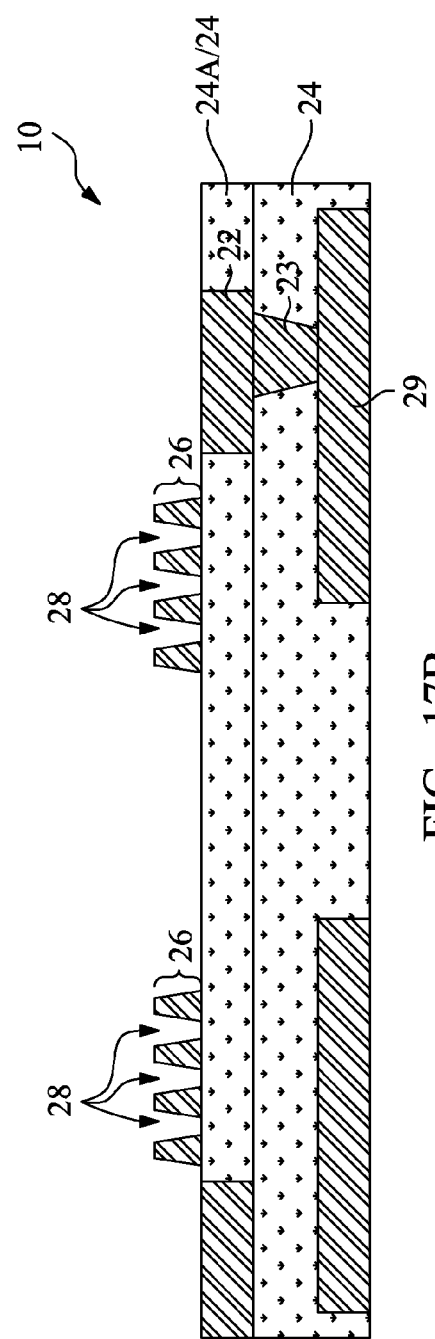

FIG. 17B illustrates package component 10 in accordance with alternative embodiments. These embodiments are similar to the embodiments in FIG. 17A, except that dielectric layer 24A is the top dielectric layer, and metal pads 26 are over the top dielectric layer. Accordingly, the sidewalls of metal pads 26 are also exposed.

FIG. 20 illustrates the component 10 in FIG. 17B bonded to package component 100. Referring to FIG. 20, which is a cross-sectional view, package component 10 includes metal pad 26 over top dielectric layer 24A. No metal trace/pad in dielectric layer 24A is directly underlying metal pad 26. As a result, solder regions 42 have bottoms in contact with the top surface of the top dielectric layer 24A. Solder regions 42 may be in contact with the outer sidewalls of metal pads 26.

In each of FIGS. 19 and 20, metal pads 26 may have the positive pattern as shown in FIG. 18A, or the negative pattern as in FIG. 18B. When the negative pattern is formed, solder regions 42 fills opening 28 (FIG. 18B) and electrically interconnect the discrete portions of metal pads 26. In addition, as also shown in FIG. 18B, solder region 42 (FIGS. 19 and 20) filled into opening 28 also connect metal pad 26 to metal trace 122.

Figure 21:
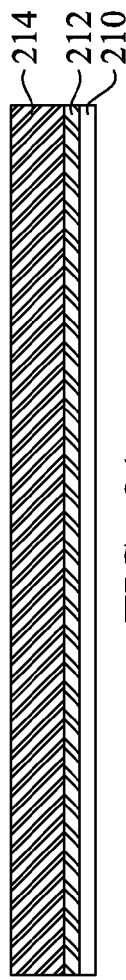
FIGS. 21 through 34 illustrate the intermediate stages in the formation of a package in accordance with alternative embodiments.

FIGS. 21 through 34 illustrate the intermediate stages in the formation of package component 10 in accordance with yet alternative embodiments. Referring to FIG. 21, seed layer 212 is formed on carrier 210. In some embodiments, carrier 210 is a glass carrier, a ceramic carrier, a blank silicon carrier, or the like. Seed layer 212 may be a copper layer, an aluminum copper layer, or may include other metals. Seed layer 212 may be formed through Physical Vapor Deposition (PVD). Mask layer 214 is further formed on seed layer 212, and may be formed of a polymer such as PBO, polyimide, an inorganic mask material such as silicon nitride, or other applicable materials.

Figure 22:
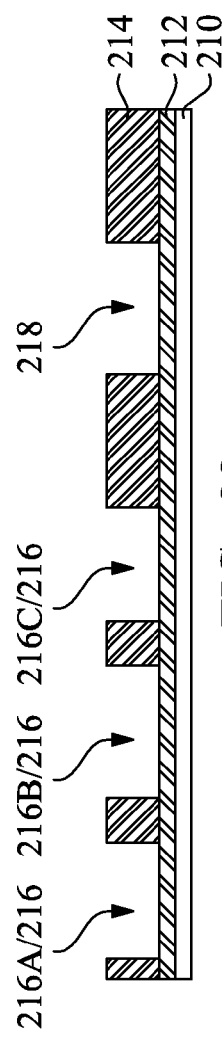
Figure 35:
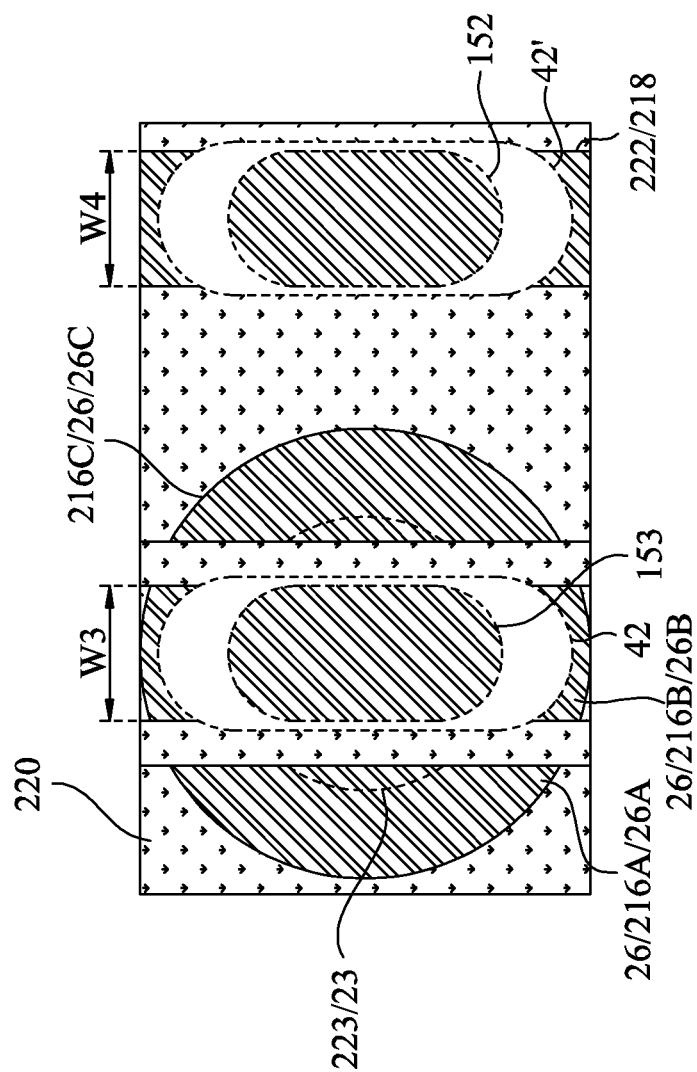
FIG. 35 illustrates a top view of a metal pad and a via in a package in accordance with some embodiments.

Next, referring to FIG. 22, mask layer 214 is patterned, forming openings 216 (including 216A, 216B, and 216C) and 218. FIG. 35 illustrates an exemplary top view of openings 216A, 216B, 216C, and 218. In accordance with some embodiments, openings 216A, 216B, and 216C in combination form three discrete portions of a circular region. The circular region has an outer perimeter of a circle, except some portions of mask layer 214 separate the circular region into three portions. The outer edges of openings 216A, 216B, and 216C may follow the profile of a circle (rounded or substantially rounded). Opening 218 is a strip shaped opening with a lengthwise dimension significantly greater than the widthwise dimension.

Figure 23:
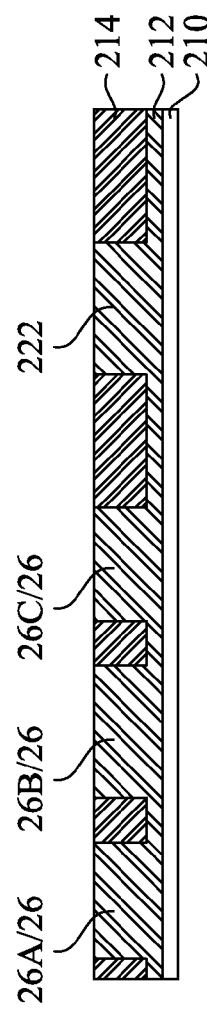
Figure 24:
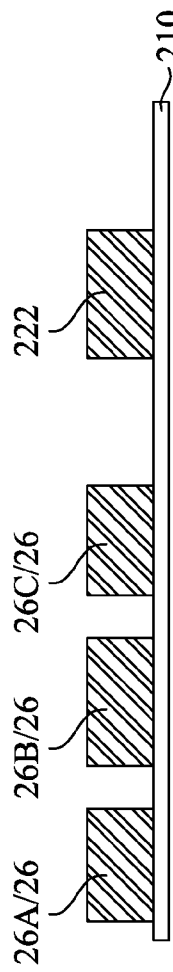

Next, referring to FIG. 23, metal pad 26 and metal trace 222 are formed in openings 216 and 218, respectively. The formation may include electro-less plating, electro-chemical plating, etc. Metal pad 26 includes three discrete portions 26A, 26B, and 26C, which are formed in openings 216A, 216B, and 216C (FIG. 22), respectively. Next, mask layer 214 is removed, followed by the removal of the portions of seed layer 212 covered by mask layer 214. The resulting structure, as shown in FIG. 24, includes metal pad 26, which include metal pad portions 26A, 26B, and 26C, and metal trace 222.

Figure 25:
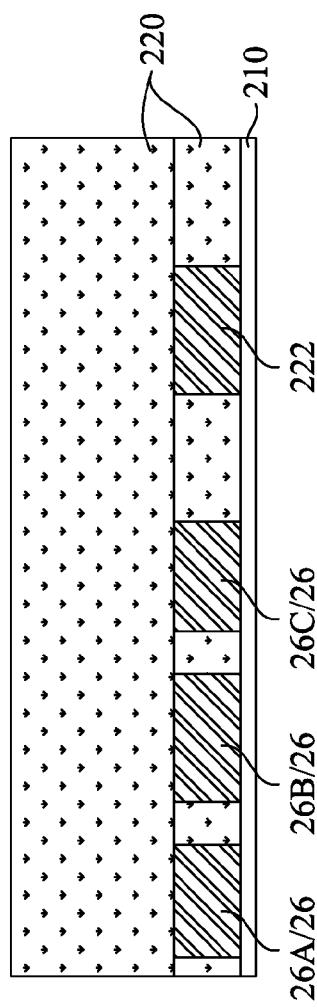

Next, referring to FIG. 25, dielectric layer 220 is formed over metal pad 26 and metal trace 222. Dielectric layer 220 may be formed of a material selected from the same candidate materials for forming dielectric layers 24A and 24B, which may be an organic dielectric material in some embodiments, although inorganic dielectric materials may also be used.

Figure 26:
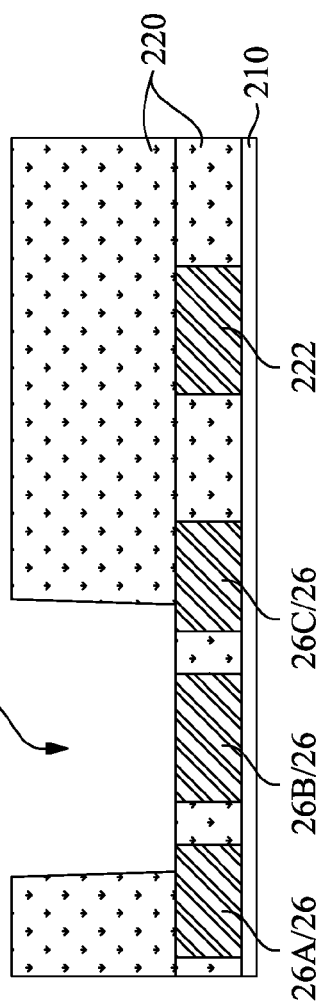

Next, as shown in FIG. 26, via opening 223 is formed in dielectric layer 220, for example, through etching. Each of portions 26A, 26B, and 26C of metal pad 26 has an inner portion (also refer to FIG. 35) exposed to via opening 223, while the outer portion of each of portions 26A, 26B, and 26C of metal pad 26 remains to be covered by dielectric layer 220. FIG. 35 illustrates a top view of via opening 223 and metal pad 26. As shown in FIG. 35, via opening 223 may have a circular shape, with portions of 26A, 26B, and 26C inside the respective circle being exposed, and the portions of 26A, 26B, and 26C outside the circle being covered.

Figure 27:
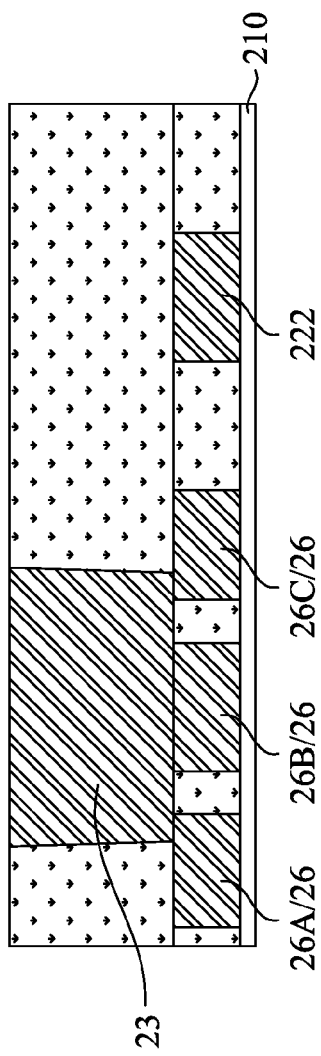

FIG. 27 illustrates the formation of via 23, which fills via opening 223 in FIG. 26. The formation of via 23 may be performed through an electro-less plating followed by an electro-chemical plating. In some embodiments, a grinding is performed to level the top surface of via 23 with the top surface of dielectric layer 220. In alternative embodiments, no grinding is performed.

Figure 28:
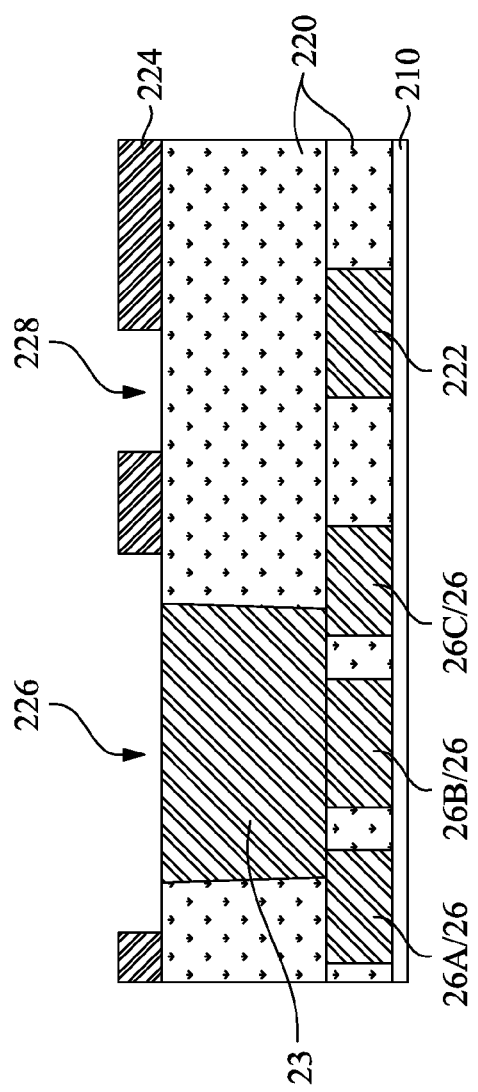

FIG. 28 illustrates the formation of mask layer 224 over via 23 and dielectric layer 220. Mask layer 224 may be formed of a polymer such as PBO, polyimide, an inorganic mask material such as silicon nitride, or other applicable materials. Next, mask layer 224 is patterned to form openings 226 and 228. Via 23 and some portions of dielectric layer 220 that encircle via 23 are exposed through opening 226. In addition, a portion of dielectric layer 220 is exposed through opening 228.

Figure 29:
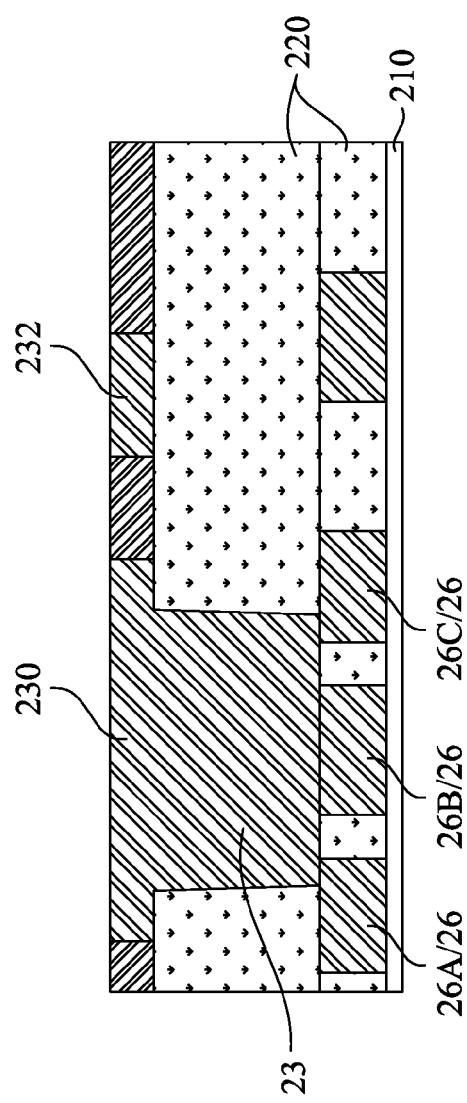
Figure 30:
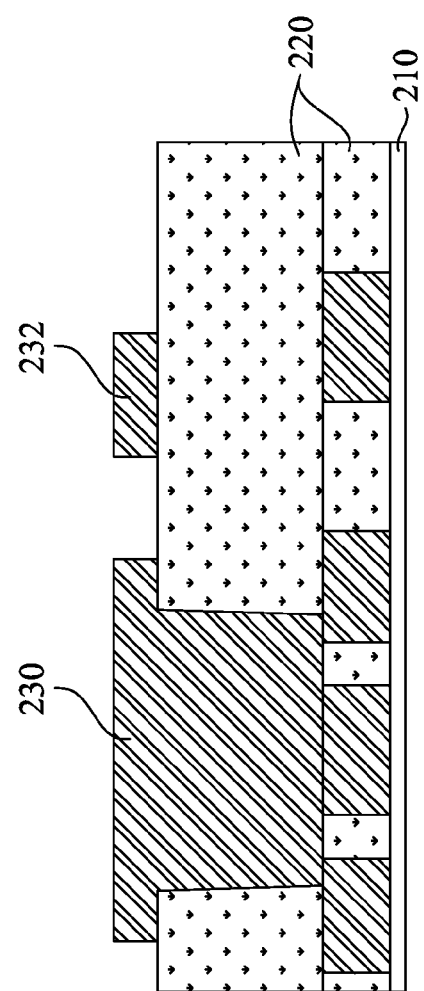

FIG. 29 illustrates the formation of metal pad 230 and metal trace 232. In accordance with some embodiments, metal pad 230 has a circular shape (in the top view), with via 23 connected to a center portion of metal pad 230. Mask layer 224 is then removed, and the resulting structure is shown in FIG. 30.

In a subsequent step, dielectric layer 234 is formed to cover the top surface of metal pad 230 and metal trace 232. The top surface of dielectric layer 234 may be higher than the top surfaces of metal pad 230 and metal trace 232 in some embodiments. In alternative embodiments, the top surface of dielectric 234 is coplanar with the top surfaces of metal pad 230 and metal trace 232.

Figure 31:
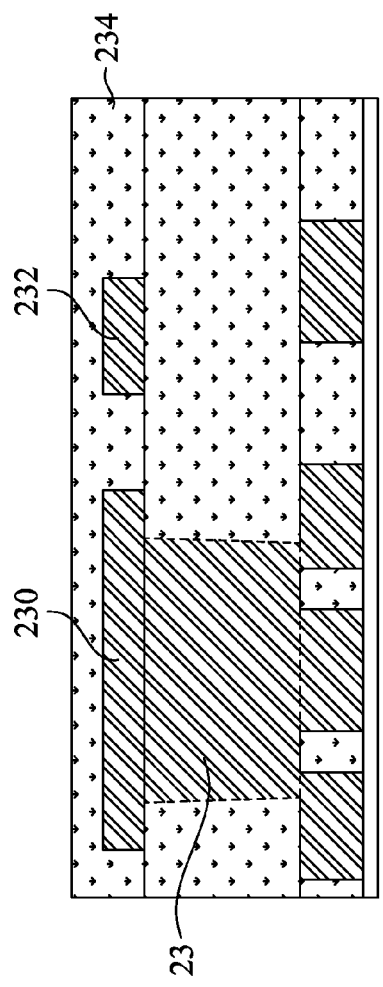
Figure 32:
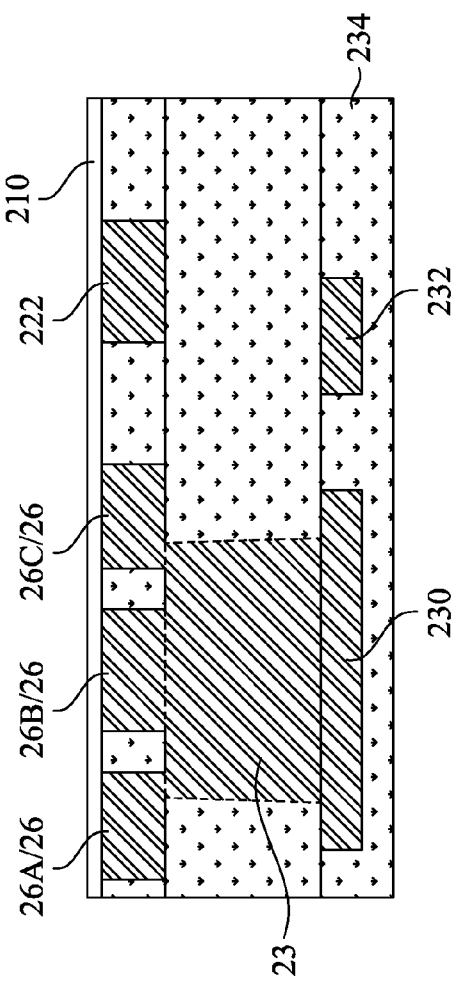
Figure 33:
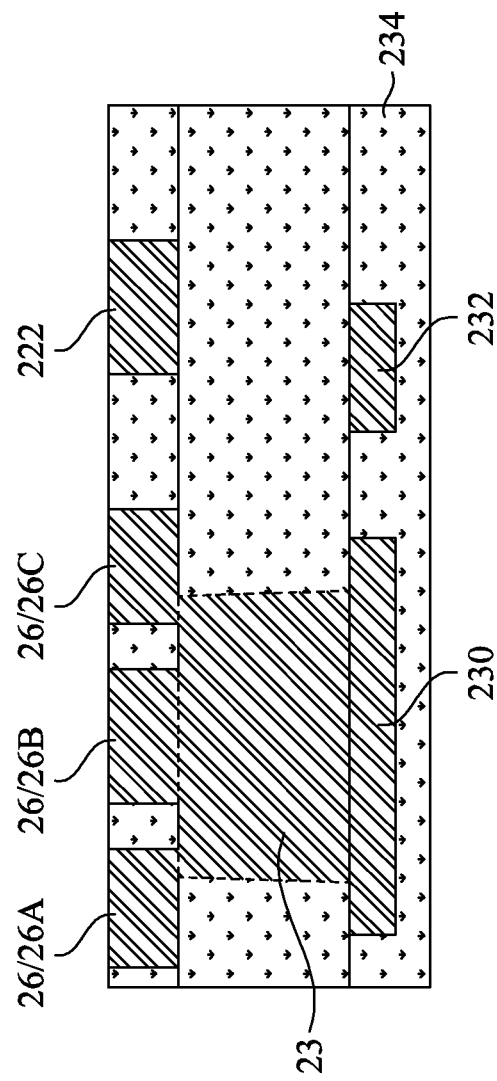

The structure shown in FIG. 31 is then flipped upside down, with carrier 210 faces up, as shown in FIG. 32. Carrier 210 is then removed, and the resulting structure is shown in FIG. 33. Metal pad 26 and metal trace 222 are exposed.

Figure 34:
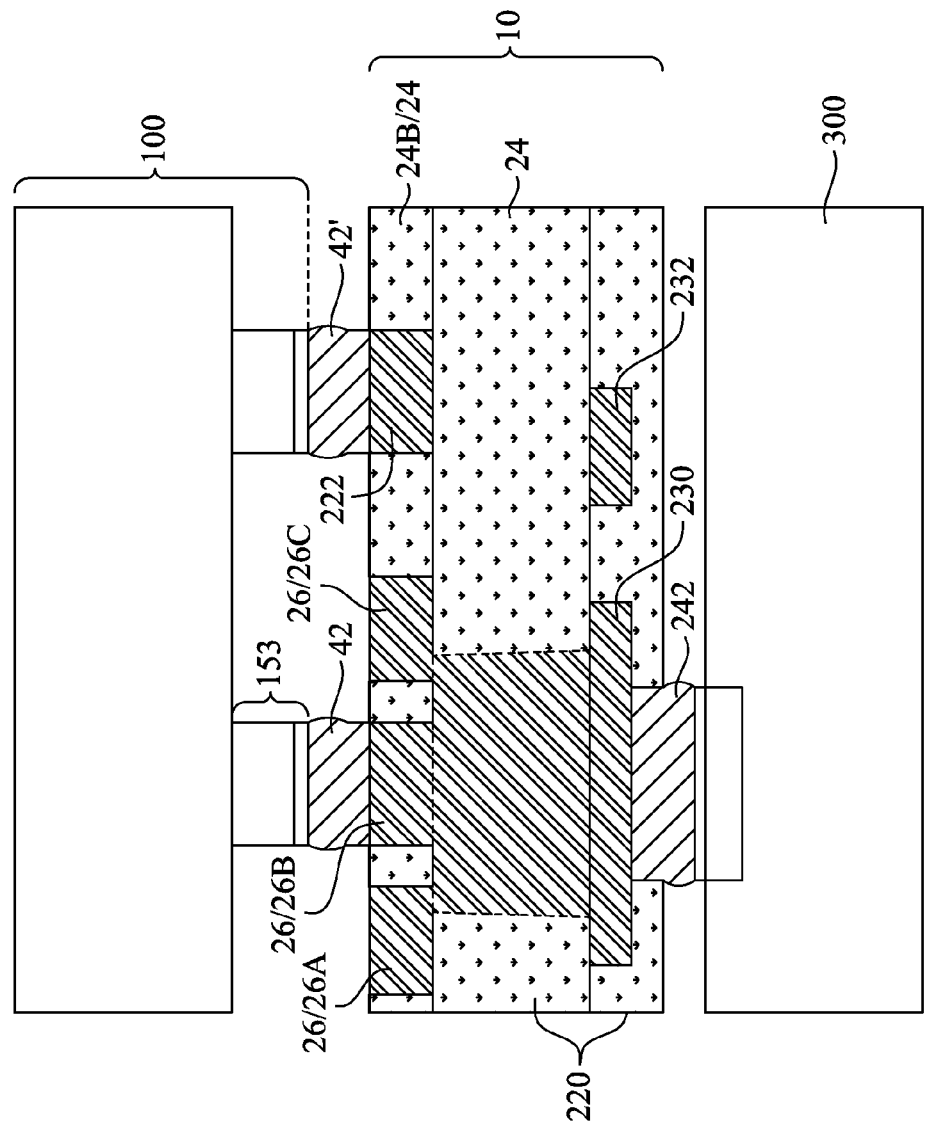

FIG. 34 illustrates a package in accordance with some embodiments. In the package, portions 26A, 26B, and 26C of metal pad 26 are included in package component 10, and are all connected to via 23. Metal pad portion 26B is further connected to solder region 42, which further bonds package component 10 to metal bump 153 of package component 100, which may be a device die in some embodiments. Metal pad 230 may be bonded to package component 300, for example, through solder region 242. Package component 300 may be a Printed Circuit Board (PCB) in some embodiments. Solder region 42 is in contact with metal pad portion 26B, and is not in contact with metal portions 26A and 26C. Accordingly, metal portions 26A and 26C are connected to, and have a same voltage as, metal portion 26B. Metal portions 26A and 26C, however, are not used to conduct current. Metal trace 222 is also connected to another solder region 42', which further bonds package component 10 to package component 100.

FIG. 35 illustrates a top view of a portion of package component 10, wherein metal pad 26, via 23, and metal bump 153 are illustrated. Solder region 42 is connected to metal pad portion 26B, and not to metal pad portions 26A and 26C. Width W3 of metal pad portion 26B is close to width W4 of metal trace 222, for example, with the difference smaller than 10 percent of both widths W3 and W4.

The above-discussed embodiments have some advantageous features, although metal pad 26 in general has a circular profile of a metal pad, the portion 26B of metal pad 26 connected to solder region 42 has a trace shape, and the width of the resulting solder is close to the width of the metal traces. Since metal pads have significantly greater areas than metal traces, in conventional structures, solder regions will spread on metal pads to have greater contacting areas, and the stresses in the solder regions connected to metal pads are different from the stresses in the solder regions connected to metal traces. By designing metal pads with center trace portions and outer portions separated from each other, the stresses in solder regions connected to metal pads are closer to the stresses in the solder regions connected to metal traces.

Figure 16A:
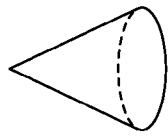
FIGS. 16A through 16I illustrate the perspective views of the discrete portions of metal pads in accordance with some embodiments.
Figure 16B:
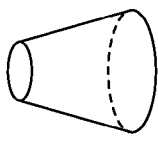
Figure 16C:
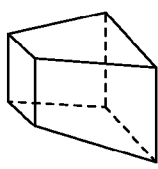
Figure 16D:
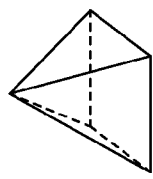
Figure 16E:
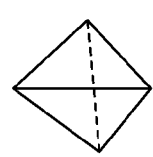
Figure 16F:
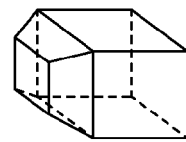
Figure 16G:
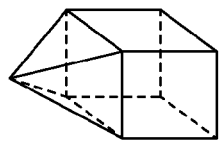
Figure 16H:
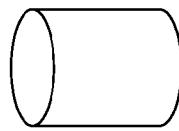
Figure 16I:
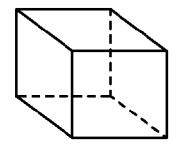

FIGS. 16A through 16G illustrate the perspective views of the discrete portions of metal pads 26 in accordance with some embodiments. Depending on the sizes and the formation conditions of metal pads 26, the discrete portions of metal pads 26 may have different shapes. For example, in FIG. 16A, the discrete portion of metal pad 26 has a bottom surface and three tilted sidewalls, with both the bottom surface and all three sidewalls having a triangular shape. In FIG. 16B, the discrete portion of metal pad 26 has a pyramidal shape. In FIG. 16C, the discrete portion of metal pad 26 has a trapezoidal shape. In FIG. 16D, the discrete portion of metal pad 26 has a circular flat top surface and a circular bottom surface as well as a slanted side edge connecting the top surface to the bottom surface. In FIG. 16E, the discrete portion of metal pad 26 has a conical shape. In FIG. 16F, the discrete portion of metal pad 26 includes a cubic lower part and a trapezoidal upper part. In FIG. 16G, the discrete portion of metal pad 26 includes a cubic lower part and a conical upper part. FIGS. 16H and 16I illustrate that the discrete portion of metal pad 26 are formed as a cylinder and a cube, respectively.

The various portions of metal pad 26 as shown in FIGS. 16A through 16I may be formed by adjusting the etching conditions for forming metal pad 26. For example, the formation of metal pad 26 may include forming a blanket metal layer and then etching the blanket layer. By adjusting the etching time (and the over-etching time) and adjusting the lateral dimensions of the discrete portions of metal pad 26, different shapes may be achieved.

In accordance with some embodiments of the present disclosure, a package component includes a dielectric layer and a metal pad over the dielectric layer. A plurality of openings is disposed in the metal pad. The first plurality of openings is separated from each other by portions of the metal pad, with the portions of the metal pad interconnected to form a continuous metal region.

In accordance with alternative embodiments of the present disclosure, a package includes a package component, which includes a metal trace, and a metal pad over the metal trace, wherein the metal pad includes a plurality of discrete portions physically separated from each other. A continuous solder region joins the plurality of discrete portions of the metal pad.

In accordance with yet alternative embodiments of the present disclosure, a package includes a first package component, which includes a metal trace including a trace portion and a pad portion connected to the trace portion. The pad portion is wider than the trace portion. The first package component further includes a metal pad overlapping and in contact with the pad portion. A plurality of openings is in the metal pad. The plurality of openings is separated from each other by portions of the metal pad, with the portions of the metal pad interconnected to form a continuous metal region. The package further includes a second package component, and a solder region bonding the second package component to the metal pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
a first package component comprising:
  a first dielectric layer;
  a second dielectric layer over and contacting the first dielectric layer;
  a metal pad over the first dielectric layer, wherein the metal pad is in the second dielectric layer; and
  a first plurality of openings in the metal pad, wherein the first plurality of openings is separated from each other by portions of the metal pad, with the portions of the metal pad interconnected to form a continuous metal region;
  a solder region in contact with the metal pad, wherein an outer edge of the solder region is in contact with a sidewall of the second dielectric layer; and a metal trace in the first dielectric layer, the metal trace comprising a second plurality of openings filled with a dielectric material.

2. The package of claim 1 further comprising:
a second package component comprising a metal pillar.

3. The package of claim 1, wherein
the metal trace comprises an edge vertically aligned with the metal pad, wherein a bottom surface of the metal pad is in contact with a top surface of the metal trace.

4. The package of claim 1, wherein the metal trace comprises:
a trace portion having a first width, wherein the trace portion extends laterally beyond edges of the metal pad from a plan view; and
a pad portion having a second width greater than the first width, wherein the metal pad overlies and contacts the pad portion of the metal trace.

5. The package of claim 4, wherein the pad portion of the metal trace is a solid pad with no opening therein.

6. The package of claim 4, wherein the pad portion of the metal trace comprises the second plurality of openings, and bottom surfaces of the solder region contacts top surfaces of the dielectric material in the second plurality of openings.

7. The package of claim 6, wherein each of the second plurality of openings is overlapped by one of the first plurality of openings.

8. The package of claim 1 further comprising a second dielectric layer comprising a portion at a same level as the metal pad, wherein the second dielectric layer comprises a top surface higher than a top surface of the metal pad.

9. The package of claim 1, wherein a top surface of the first dielectric layer is exposed.

10. A package comprising:
a first package component comprising:
a metal trace; and
a metal pad over the metal trace, wherein the metal pad comprises a plurality of discrete portions physically separated from each other, wherein the plurality of discrete portions is electrically coupled to each other through the metal trace.

11. The package of claim 10 wherein bottoms of the plurality of discrete portions of the metal pad are in contact with a dielectric material, and edges of the plurality of discrete portions of the metal pad are vertically aligned to respective edges of corresponding portions of dielectric material.

12. The package of claim 10 further comprising:
a solder region physically contacting one of the plurality of discrete portions of the metal pad, and physically disconnected from remaining ones of the plurality of discrete portions of the metal pad; and
a via interconnecting the plurality of discrete portions of the metal pad.

13. The package of claim 10 further comprising a continuous solder region joining the plurality of discrete portions of the metal pad.

14. The package of claim 10, wherein the metal trace comprises:
a trace portion having a first width, wherein the trace portion laterally extends beyond edges of the metal pad in a plan view; and
a pad portion having a second width greater than the first width, wherein the metal pad overlies and contacts the pad portion of the metal trace.

15. The package of claim 14, wherein the pad portion of the metal trace is a solid pad with no opening therein.

16. The package of claim 10, wherein the plurality of discrete portions are fully separated from each other without being interconnected by other portions of the metal pad.

17. The package of claim 10, wherein an entirety of a bottom surface of the metal pad is in contact with a top surface of the metal trace.

18. A package comprising:
a first package component comprising:
a metal trace comprising a trace portion and a pad portion connected to the trace portion, wherein the pad portion is wider than the trace portion in a top view of the first package component;
a metal pad overlapping and in contact with the pad portion, wherein the trace portion and the pad portion are in a same metal layer, and the trace portion of the metal trace extends beyond edges of the metal pad in a plan view; and
a first plurality of openings in the metal pad, wherein the first plurality of openings is separated from each other by portions of the metal pad, with the portions of the metal pad interconnected to form a continuous metal region, the first plurality of openings being wider at a region more distal from the metal trace than at a region more proximate to the metal trace;
a second package component; and
a solder region bonding the second package component to the metal pad.

19. The package of claim 18, wherein the first plurality of openings comprises through-openings penetrating through the metal pad.

20. The package of claim 18, wherein the pad portion of the metal trace comprises a second plurality of openings, with the second plurality of openings filled with a dielectric material.

* * * * *